United States Patent [19]

Chacon

[11] Patent Number: 6,128,588
[45] Date of Patent: Oct. 3, 2000

[54] INTEGRATED WAFER FAB TIME STANDARD (MACHINE TACT) DATABASE

[75] Inventor: Guillermo Rudolfo Chacon, San Antonio, Tex.

[73] Assignees: Sony Corporation, Tokyo, Japan; Sony Electronics, Inc., Park Ridge, N.J.

[21] Appl. No.: 08/941,831

[22] Filed: Oct. 1, 1997

[51] Int. Cl.[7] ................................................. G06G 7/48
[52] U.S. Cl. ......................................................... 703/6
[58] Field of Search ........................... 395/500.27; 703/6; 707/103; 700/102, 100

[56] References Cited

U.S. PATENT DOCUMENTS

| | | | |
|---|---|---|---|
| 5,396,432 | 3/1995 | Saka et al. | 364/368.18 |
| 5,479,343 | 12/1995 | Matoba et al. | 364/468.13 |
| 5,751,580 | 5/1998 | Chi | 364/468.07 |

OTHER PUBLICATIONS

Levitt et al.; "Just–in–Time Methods for Semiconductor Manufacturing"; IEEE Advanced Semiconductor Manufact, Workshop; pp. 3–9, Sep. 1990.

Stone et al.; "Designing Time Critical Systems with TACT"; IEEE Euromicro Workshop on Real Time; pp. 74–82, Jun. 1989.
Corbett et al.: "Modeling Just–in–Time Production Systems: a Critical Review"; IEEE Winter Simulation Conf.; pp. 819–828, Dec. 1993.

*Primary Examiner*—Kevin J. Teska
*Assistant Examiner*—Hugh Jones
*Attorney, Agent, or Firm*—Ronald P. Kananen; Rader, Fishman & Grauer

[57] ABSTRACT

An integrated wafer fab production characterization and scheduling system incorporates a manufacturing execution system with a scheduling system based on simulation. The integrated characterization/scheduling system provides manufacturing with a simulation tool integrated with the manufacturing execution system to evaluate proposed production control logic as a practical alternative to expensive experimentation on actual production system. Furthermore, simulation models are used to create short term dispatch schedules to steer daily manufacturing operations towards planned performance goals. Innovative features include integration of preventive maintenance scheduling, Kanban based WIP control, an integrated time standard database, a, and real time lot move updates.

8 Claims, 10 Drawing Sheets

FIG. 5

FAB SIMULATOR AND SCHEDULER

Action  Edit  Block  Item  Record  Query                                    Help Schedule/Dispatch List Equip Id [P108]        Equip Cluster [  ]         Refresh Time  [14:38:03]   [REFRESH]

Equip Type [  ]                      Lot [  ]  [ALL]   Creation Time [SEP-26 12:20]

Fab Area [  ]                                                Rows [4]

| Equip ID | Prior | Lot ID | Equip Prog ID | Stage | Device | Start | Type | Qty |
|---|---|---|---|---|---|---|---|---|
| P100 | 5 | 638665.1 | 3 2AI PR | 2AI PR | K7713-K | SEP-26 15:59 | P | 25 |
| P100 | 5 | 638666.1 | 3 2AI PR | 2AI PR | K7713-K | SEP-26 15:59 | P | 25 |
|  |  |  |  |  |  |  |  |  |
|  |  |  |  |  |  |  |  |  |
|  |  |  |  |  |  |  |  |  |
|  |  |  |  |  |  |  |  |  |
|  |  |  |  |  |  |  |  |  |
| P100 | 5 | 680035.1 | 4 PAD PR | PAD.PR | 3K7716-K | SEP-26 12:28 | Q | 25 |
| P100 | 5 | 680036.1 | 4 PAD PR | PAD.PR | 3K7716-K | SEP-26 12:28 | Q | 25 |
|  |  |  |  |  |  |  |  |  |
|  |  |  |  |  |  |  |  |  |
|  |  |  |  |  |  |  |  |  |
|  |  |  |  |  |  |  |  |  |

Count:*0                              <Insert>

FIG. 7

| Flag | Stnfam (Equip Type) | Stage | T1 | T21 | T22 | T23 | T24 | T25 | T3 | Batch Qty | Formula | Ptime | Stime | Unsetup |
|---|---|---|---|---|---|---|---|---|---|---|---|---|---|---|
| PROD | HICURRI | 2CON.II | 10.000 | 20.600 | 3.900 | 52.400 | 6.700 | 0.800 | 0.700 | 200 | HICURRI | 0.422 | 10.000 | 0.700 |
| PROD | HICURRI | 2CON.II | 10.000 | 20.600 | 3.900 | 52.400 | 6.700 | 0.800 | 0.700 | 200 | HICURRI | 0.422 | 10.000 | 0.700 |
| PROD | HICURRI | 2CON.II | 10.000 | 20.600 | 3.900 | 53.400 | 6.700 | 0.800 | 0.700 | 200 | HICURRI | 0.427 | 10.000 | 0.700 |
| PROD | HICURRI | 2CONP.II | 10.000 | 20.600 | 3.900 | 270.600 | 6.700 | 0.800 | 0.700 | 200 | HICURRI | 1.513 | 10.000 | 0.700 |
| PROD | HICURRI | 2CONP.II | 10.000 | 20.600 | 3.900 | 270.600 | 6.700 | 0.800 | 0.700 | 200 | HICURRI | 1.513 | 10.000 | 0.700 |
| PROD | HICURRI | 3PS.II | 10.000 | 20.600 | 3.900 | 72.000 | 6.700 | 0.800 | 0.700 | 200 | HICURRI | 0.520 | 10.000 | 0.700 |
| PROD | HICURRI | 3PS.II | 10.000 | 20.600 | 3.900 | 72.000 | 6.700 | 0.800 | 0.700 | 200 | HICURRI | 0.520 | 10.000 | 0.700 |

TACT Formula Definition

Formula: HICURRI
Ptime: (T21+T22+T23+T24+T25)/Batchqty
Stime: T1
Unsetuptime: T3
Laptime: ((T21+T22+T23+T24+T25+T3)*.17)/60

Test Data

| Stnfam | Stage | Recipe Title (Recipe Title) | Equip Prog Id (Equipmentprogid) | Reticle id (reticleid) | T0 | T1 | T21 |

FIG. 9

| Stage | Kanban Index | Equip Prog Id | Lap | Target | Cum Target | Std Wip | Std Lots | Cum Lots | Qty | Manage Factor | Adjust Qty |
|---|---|---|---|---|---|---|---|---|---|---|---|
| LASCRIBE | LASER1001.200 | PRODUCT1 | 0.278 | 0.012 | 1 | 0.012 | 0.000 | 0.000 | 2 | 2.5 | 5 |
| 10X.SC | 10XSC001.000 | 12 | 0.167 | 0.007 | 1 | 0.007 | 0.000 | 0.001 | 0 | 1 | 0 |
| 10X | 10X2001.000 | INITOX | 4.445 | 0.185 | 1 | 0.185 | 0.007 | 0.008 | 0 | 1 | 0 |
| 10X | 10X2001.000 | | 4.444 | 0.000 | 1 | 0.000 | 0.000 | 0.008 | 0 | 1 | 0 |
| 10X | 10X2011.000 | 10X.PRO | 0.250 | 0.010 | 1 | 0.010 | 0.000 | 0.009 | 0 | 1 | 0 |
| POX.SC | POXSC001.000 | 13 | 0.209 | 0.009 | 1 | 0.009 | 0.000 | 0.009 | 0 | 1 | 0 |
| PAD.OX | PADOX2001.000 | PADOX | 3.657 | 0.152 | 1 | 0.152 | 0.006 | 0.015 | 0 | 1 | 0 |
| PAD.OX | PADOX2001.000 | | 3.773 | 0.000 | 1 | 0.000 | 0.000 | 0.015 | 0 | 1 | 0 |
| PAD.OX | PADOX2011.000 | 5/11/XX | 0.060 | 0.002 | 1 | 0.002 | 0.000 | 0.015 | 0 | 1 | 0 |
| PPS.CVD | PPSCVD2001.000 | H480 | 3.765 | 0.157 | 1 | 0.157 | 0.006 | 0.021 | 0 | 1 | 0 |
| PPS.CVD | PPSCVD2011.000 | 05/15/02 | 0.060 | 0.003 | 1 | 0.002 | 0.000 | 0.021 | 0 | 1 | 0 |
| PPS.OX | PPSOX2001.000 | PPSOX | 4.209 | 0.175 | 1 | 0.175 | 0.007 | 0.028 | 2 | 3 | 6 |
| PPS.OX | PPSOX2001.000 | | 4.325 | 0.000 | 1 | 0.000 | 0.000 | 0.028 | 0 | 1 | 0 |
| PPS.OX | PPSOX2011.000 | 05/11/XX | 0.060 | 0.002 | 1 | 0.002 | 0.000 | 0.029 | 0 | 1 | 0 |
| 1SINCVD | SINCVD2001.000 | SN1000 | 5.382 | 0.224 | 1 | 0.224 | 0.009 | 0.038 | 0 | 1 | 0 |
| 1SINCVD | SINCVD2011.000 | 1SNC.PRO | 0.250 | 0.010 | 1 | 0.010 | 0.000 | 0.038 | 0 | 1 | 0 |

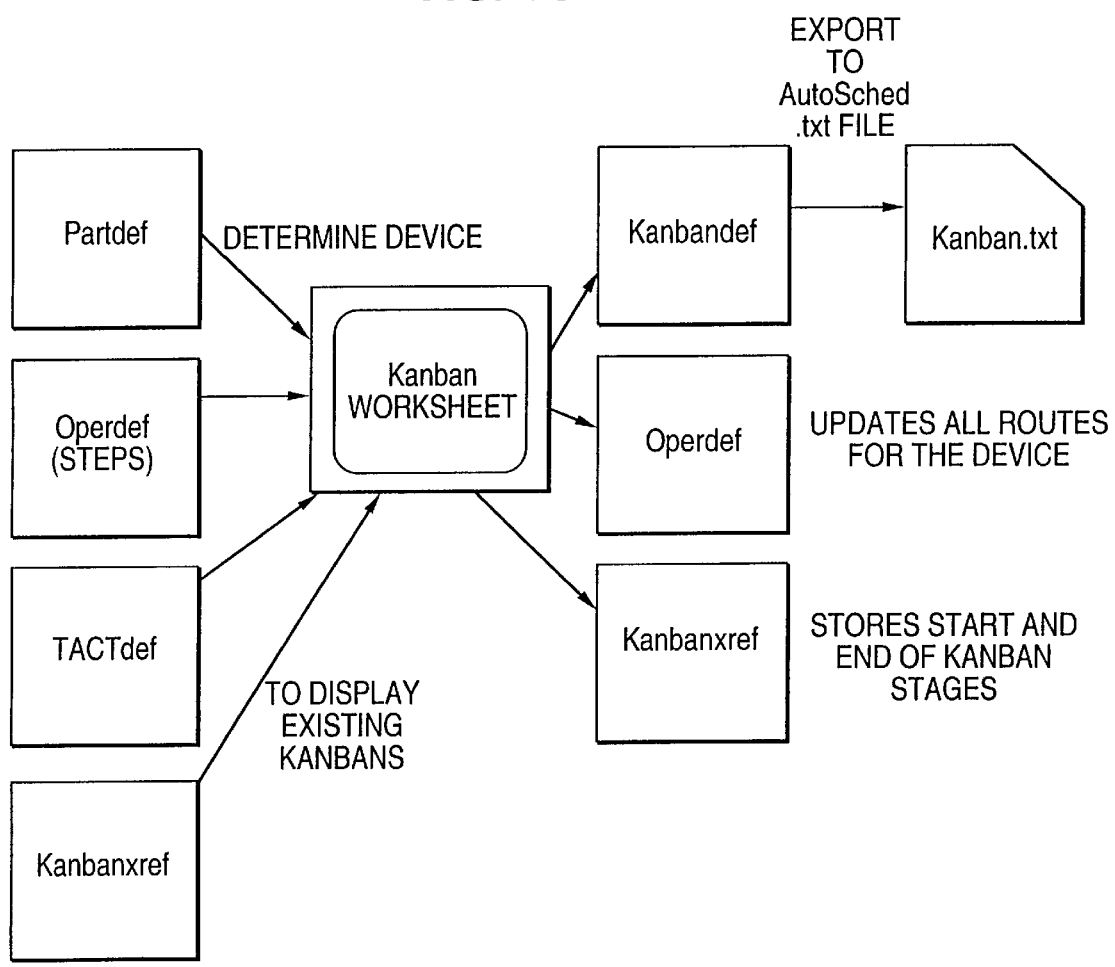

INTEGRATED WAFER FAB TIME STANDARD (MACHINE TACT) DATABASE

RELATED APPLICATIONS

This application is related to U.S. patent application Ser. No. 08/941,831 entitled "INTEGRATED WAFER FAB TIME STANDARD (MACHINE TACT) DATABASE" and to U.S. patent application Ser. No. 08/941,825 entitled "INTEGRATED WAFER FABRICATION PRODUCTION CHARACTERIZATION AND SCHEDULING SYSTEM.".

FIELD OF INVENTION

The present invention relates to a control process and systems for manufacturing. In particular, the present invention relates to an integrated scheduling process and system for wafer fabrication.

BACKGROUND OF THE INVENTION

The current, highly competitive, semiconductor market is forcing semiconductor companies to remain competitive in terms of productivity and time to market. Competitive semiconductor manufacturing companies focus on reducing manufacturing time while maintaining or increasing production output. Reducing manufacturing time is accomplished by reducing Work In Process ("WIP") inventory so that manufacturing time is reduced but production output is not decreased. Manufacturing time will also be reduced when variation in the production line is reduced. The less variation in the production line, the shorter that cycle time can be made.

Minimzing WIP inventory and reducing manufacturing time are usually accomplished by efficient scheduling and dispatching of lots to be processed so as to reduce the amount of time each lot waits at a particular station. One known scheduling and dispatching solution is to use simulation techniques. Simulation based scheduling provides the benefit of testing the scheduling rules in the simulation environment before the scheduling rules are implemented. Simulation based scheduling also provides an integrated system between simulation and the scheduler functions in order to timely evaluate and implement scheduling rules and scheduling parameter changes.

A weakness found in many prior art simulation projects is the obsolescence of data used by the simulation model. Wafer fabrication, for example, involves complex dynamic production systems. The measurement of their capacity and performance such as lead time and wafer output are not accurate enough if a solution capable of modeling the dynamic fabrication conditions and variance in the system is not used. The main problem is that building a complete fabrication simulation model manually is a daunting task that requires many hours and coordination between many personnel to finish the task timely before the model, i.e., logic and data, become obsolete. Also of note is that the maintenance of the simulation models is complex and expensive.

Traditional system integration efforts have focused on using mapping programs in programming languages such as FORTRAN or C, but these systems are not very flexible to user required changes in output and input of the mapping program. Others have tried developing a dynamic Manufacturing Execution System ("MES"), but MES do not have all the data and logic required to build a valid fabrication simulation model. The main purpose of an MES is to execute processes to perform the actual manufacturing functions. Additional data and logic must be added to augment the database of the MES.

For example, in wafer fabrication facilities, process times are mostly dominated by equipment which means that the biggest component of the manufacturing process time is spent inside the equipment. Having accurate time standards to reflect both time by operator and time in equipment is critical in the final production planning and control calculations. A system is needed that has the ability to integrate simulation with current data and logic from the MES, to augment gathered parameters with additional data and logic required for a valid customized model, to create scheduling and dispatching orders with a simulation run, and to display the dispatch orders to the manufacturing floor.

SUMMARY OF THE INVENTION

The present invention relates to an integrated characterization and scheduling system for fabrication production systems such as wafer fabrication. In particular, the present invention is directed to a machine tact (time standard) modeling system for use with a manufacturing execution system. According to the present invention, a method and system for creating customized machine tact information includes defining time standards as a function of process parameters and equipment parameters. For example, if a process parameter such as temperature, pressure, etc. and an equipment parameter such as equipment brand name, model, etc. are entered, the system creates and suggests the time standard to use for those times that are not likely to have large variations.

BRIEF DESCRIPTION OF DRAWINGS

The features and inventive aspects of the present invention will become more apparent upon reading the following detailed description, claims, and drawings, of which the following is a brief description:

FIG. 5 is a sample of a simulation/scheduler screen.

FIG. 7 is a sample of a machine tact modeler screen.

FIG. 9 is a sample of a Kanban worksheet screen.

FIG. 10 is a block diagram of the Kanban design module of the present invention.

DETAILED DESCRIPTION OF THE INVENTION

Figure 1:
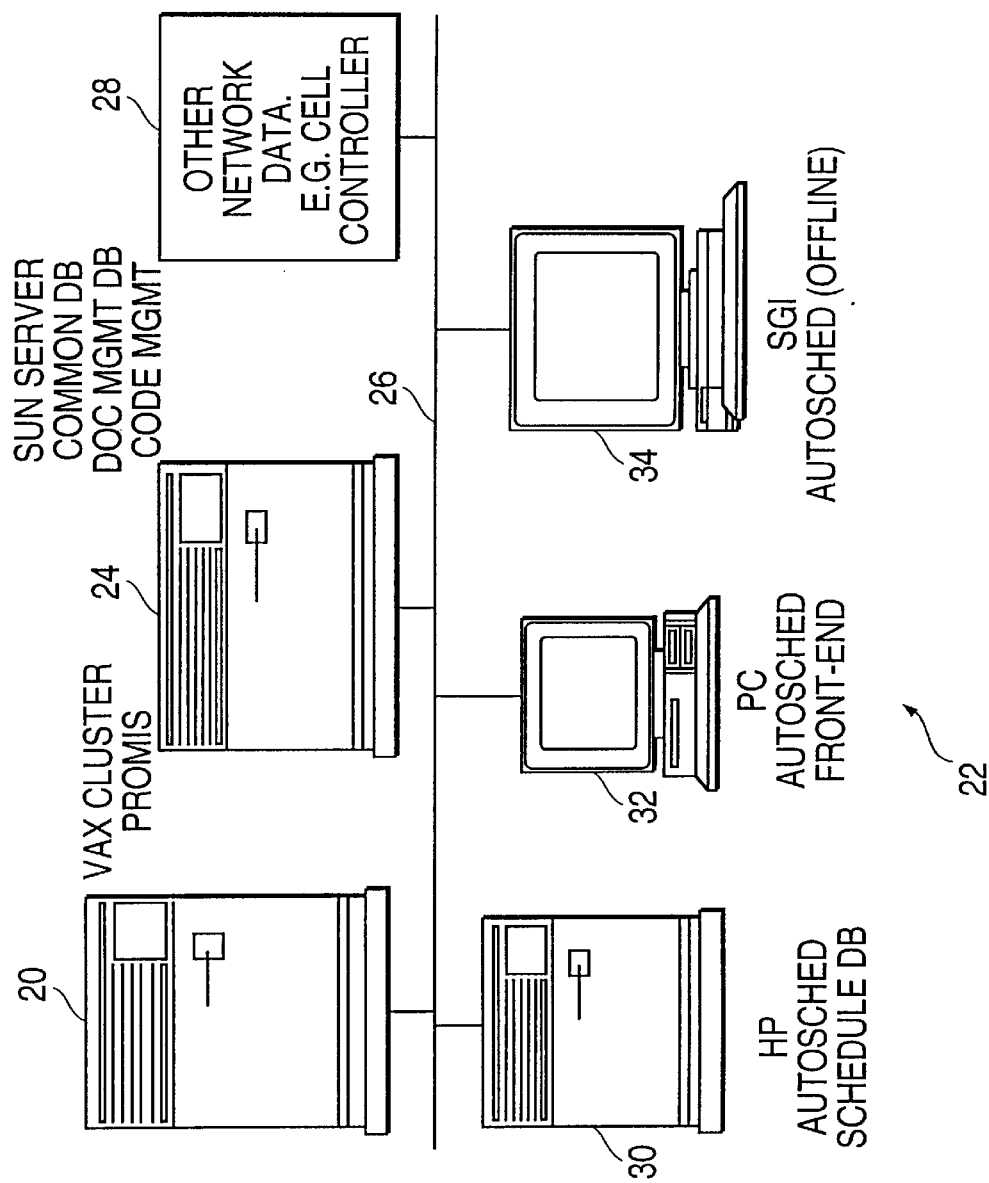
FIG. 1 is a schematic diagram of an integrated characterization and scheduling system of the present invention.

As shown in FIG. 1, an integrated scheduling system of the present invention includes manufacturing execution system 20, autoscheduling system 22, and common database 24, all interconnected by data bus 26. Other network controllers 28 may be attached to data bus 26. Autoscheduling system 22 includes scheduler database 30, online scheduling workstation 32, and offline simulator workstation 34. Scheduler database 30 stores production models for simulation as well as data extracted from the manufacturing execution system 20 to be used for the simulation. The stored information includes T1 and T2 parameters, lot status, machine tact (time standard), and Kanban worksheets. Online scheduling workstation 32 is used during automated operation of autoscheduling system 22 to view and perform manual corrections to the parameters to be sent to the manufacturing execution system 20. Front-end client application software is used to provide a graphical user interface ("GUI") to allow a user to manage and display all the parameters stored in scheduler database 30. Offline workstation 34 is used to create and manage production models used by the autoscheduling system 22 to create schedules to be used by the manufacturing execution system 20.

Figure 2:
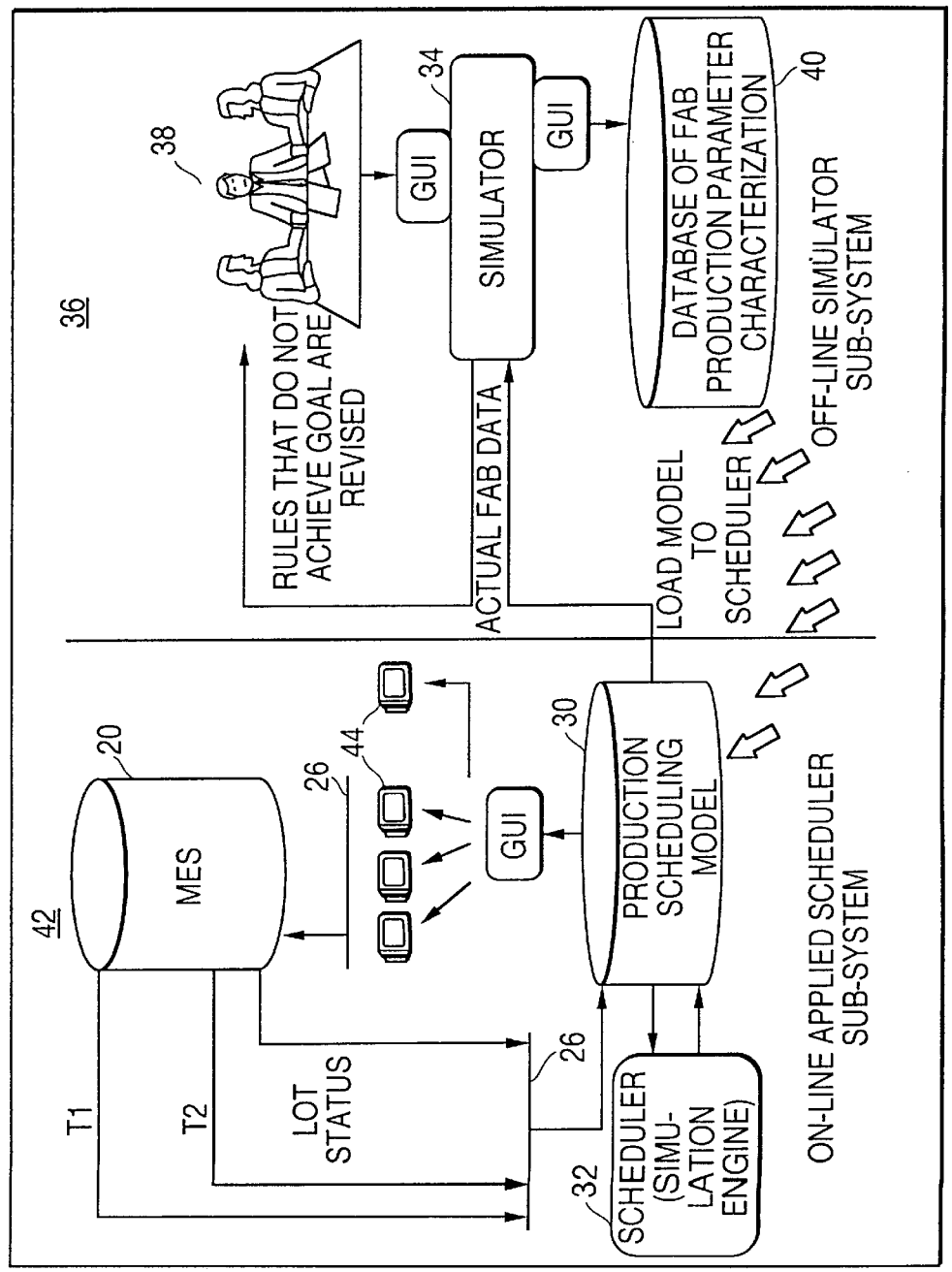
FIG. 2 is a block diagram of a functional overview of the present invention.

As shown in FIG. 2, the integrated scheduling system of the present invention has two parallel modes of operation: offline simulation and online scheduling. Offline simulation mode is accomplished through offline simulator subsystem 36. During offline work, the objective is to perform studies following a "Plan, Do, Check, Act" ("PDCA") cycle. At the beginning of the planning cycle, offline subsystem 36 helps in the preparation of feasible production plans that will meet required fabrication performance measures. Once a plan is established, the focus is shifted to monitoring progress of the plan versus actual performance. Corrective action is taken if a deviation from the plan is observed.

For example, during offline operations, the production team 38 brainstorms to propose production control logic in terms of model parameters and scheduling rules to develop a production model that achieves desired fabrication performance measures such as wafer output and reduced cycle time. The proposed model is entered into the offline simulator workstation 34 through user-friendly graphical user interface, and a simulation is run on the entered model to obtain a performance prediction of the proposed model. During the simulation run, actual fabrication data extracted from manufacturing execution system 20 is used to evaluate the simulated model.

Figure 3:
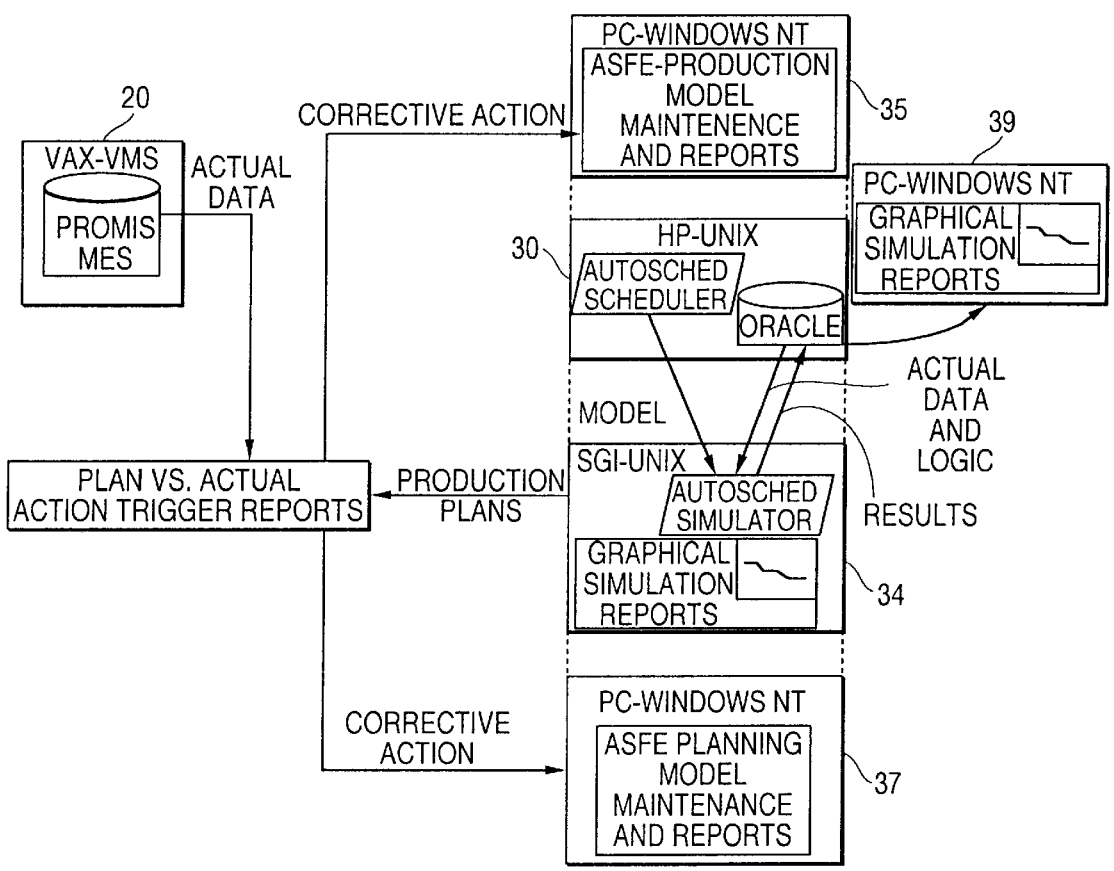
FIG. 3 is a block diagram of an offline simulator subsystem of the present invention.

Based on the simulation results, any logic or parameter that improves the performance of the production system towards the goal becomes part of a model that will be used for production planning and short-term scheduling dispatch. Logic or parameters that do not improve production performance are returned to the production team for re-evaluation and revision. This process is repeated until an acceptable model is developed and the parameter characterization is stored in a temporary database 40 inside offline simulation workstation 34 until the model is loaded to the scheduler database 30. A more detailed diagram of offline subsystem 36 is shown in FIG. 3.

Online scheduling mode is accomplished through an online applied scheduler subsystem 42. During online scheduling mode, the process of creating dispatch schedules for manufacturing execution system 20 is performed automatically. The production model created using offline subsystem 36 is loaded from temporary database 40 to scheduler database 30. Also, the scheduler database 30 uses the most recent parameter information from the manufacturing execution system 20, e.g., T1, T2, and lot status, which is stored therein and constantly updated. A "T1" download extracts static information such as parts, equipment, and process routing information. A "T2" download extracts status data including WIP status, equipment status, and preventive maintenance task schedule and status.

Figure 4:
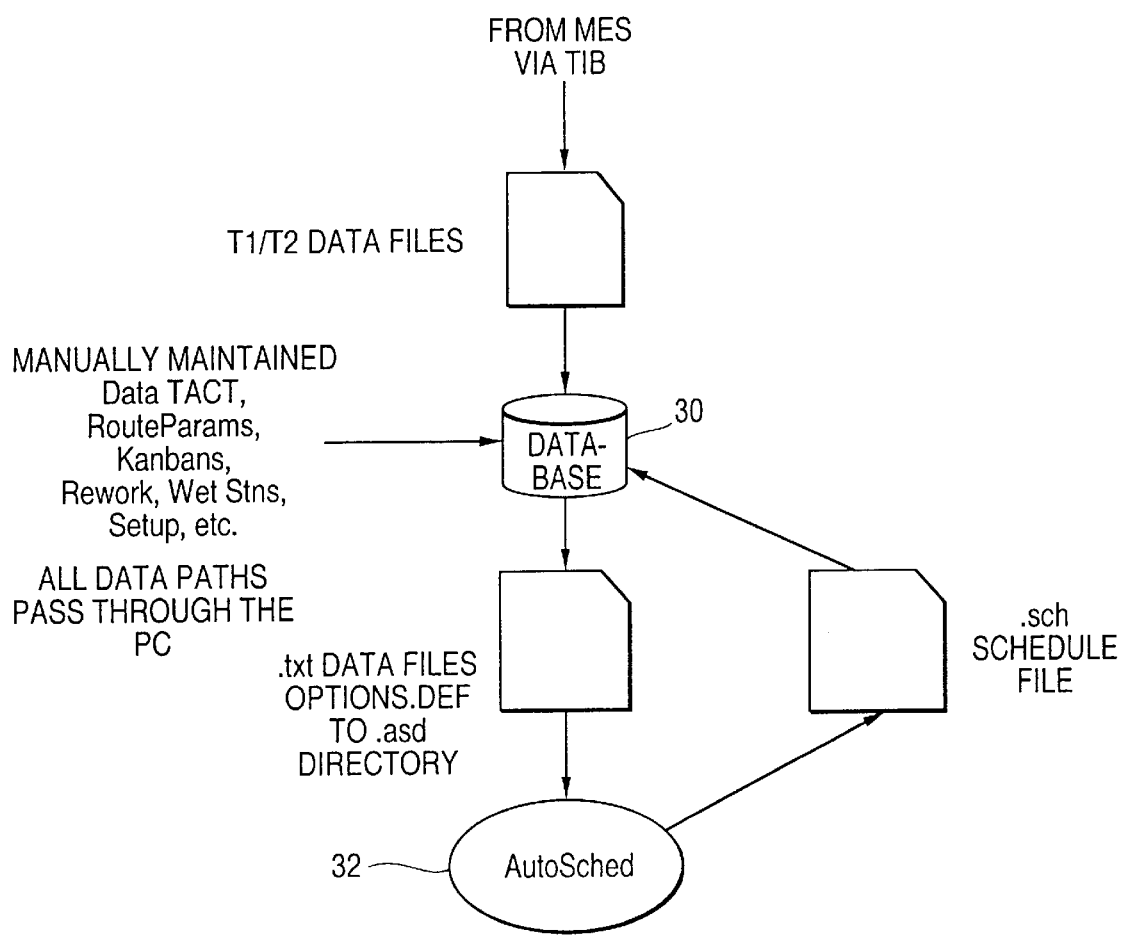
FIG. 4 is a block diagram of a file extraction procedure of the present invention.

The front-end client application responsible for managing information in the scheduler database 30 is also responsible for performing data downloads. As shown in FIG. 4, a front-end client application polls at an interval of 15 seconds for arrival of completion file flags. If a T1 flag is found, the front-end client automatically imports the data into the scheduler database 30. Upon completion of the import, the system goes back to polling. If a T2 flag is found, the front-end client automatically imports the data into the scheduler database 30 and then augments the imported data with data residing in the database to export the required data for the simulation run.

Once a production model is loaded into the scheduler database 30 and the data from the manufacturing execution system 20 is downloaded, a command is sent to a queuing program which starts the simulation run automatically. If more than one command is received, the queuing program runs the simulations sequentially in the order the commands are received. A simulation engine in the scheduler 32 runs a simulation using the loaded model, downloaded parameter information such as T1 and T2 parameters, machine tact information, and Kanban worksheets stored in the scheduler database 30.

Upon successful completion of the simulation run, the scheduler 32 outputs a schedule of events to occur in the manufacturing execution system 20. This schedule is imported back into the scheduler database 30. A dispatch list on the current lot status is created from this schedule reflecting the current conditions in the manufacturing execution system 20.

On a real time basis, a lot status table is maintained in the scheduler database 30 to keep the current status of each product lot pending in the manufacturing execution system 20 at any given time. In this way, the lot status in the scheduler database 30 is a mirror image of the lot status in manufacturing execution system 20. Updates on the status of lots moving into and out of a process step are sent by the manufacturing execution system 20 through the bus 26 and directly inserted into the scheduler database 30. A database procedure running in scheduler database 30 processes each inserted event as soon as it arrives to insure updates of lot status information.

Figure 6:
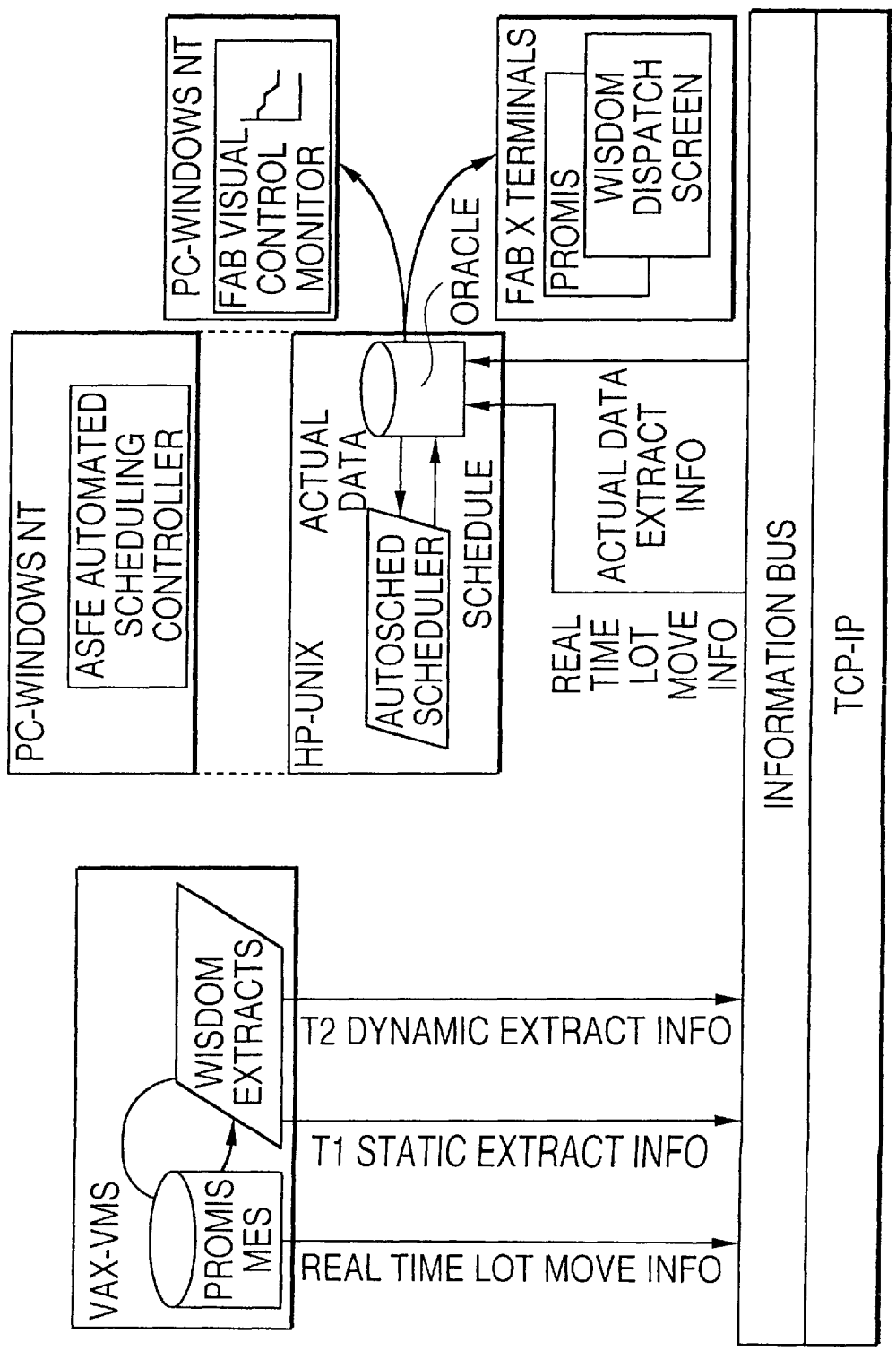
FIG. 6 is a block diagram of an online applied scheduler subsystem of the present invention.

The created schedules are also sent via a graphical user interface to guidance terminals 44 for monitoring purposes. Dispatch schedules are updated in the scheduler database 30 with every lot moving in real time. A lot moving from a "running" status to a "waiting at next process step" status receives an assigned station and scheduled start time before updating the lot status information used in dispatch. An unscheduled event may make the schedule significantly obsolete. For example, a supervisor has an option of re-creating the schedule manually from any of the guidance terminals 44 before uploading to manufacturing execution system 20. FIG. 5 shows a sample graphical user interface screen for monitoring or modifying information in the system. A more detailed diagram of the online subsystem 42 is shown in FIG. 6.

Machine Tact (time standard) Modeler

As mentioned above, scheduler database has stored thereon machine tact (time standard) information. Since time standards are used by other systems in a fabrication system, they must be stored in an open database accessible to other systems. Online subsystem 42 of the present invention includes a machine tact (time standard) modeler (not shown) for modeling time standards customized for a particular system.

The machine tact modeler of the present invention quickly matches and merges process times into the process steps before the routings are sent to scheduler 32. The machine tact modeler defines time standards as a function of process parameters and equipment parameters. For example, if a process parameter such as temperature, pressure, etc. and an equipment parameter such as equipment brand name, model, etc. are entered, online subsystem 42 calculates and suggests a time standard to use for those times that are not likely to have large variations. In this way, the machine tact modeler of the present invention provides the times scheduler 32 needs for accurate simulation runs, schedules, and results. Maintaining the machine tact data in scheduler database 30 ensures that the simulator and scheduler always use the latest machine tact measurements and the machine tact data is managed through the front-end client application. FIG. 7 shows a sample graphical user interface screen for monitoring and modifying machine tact information.

Figure 8:
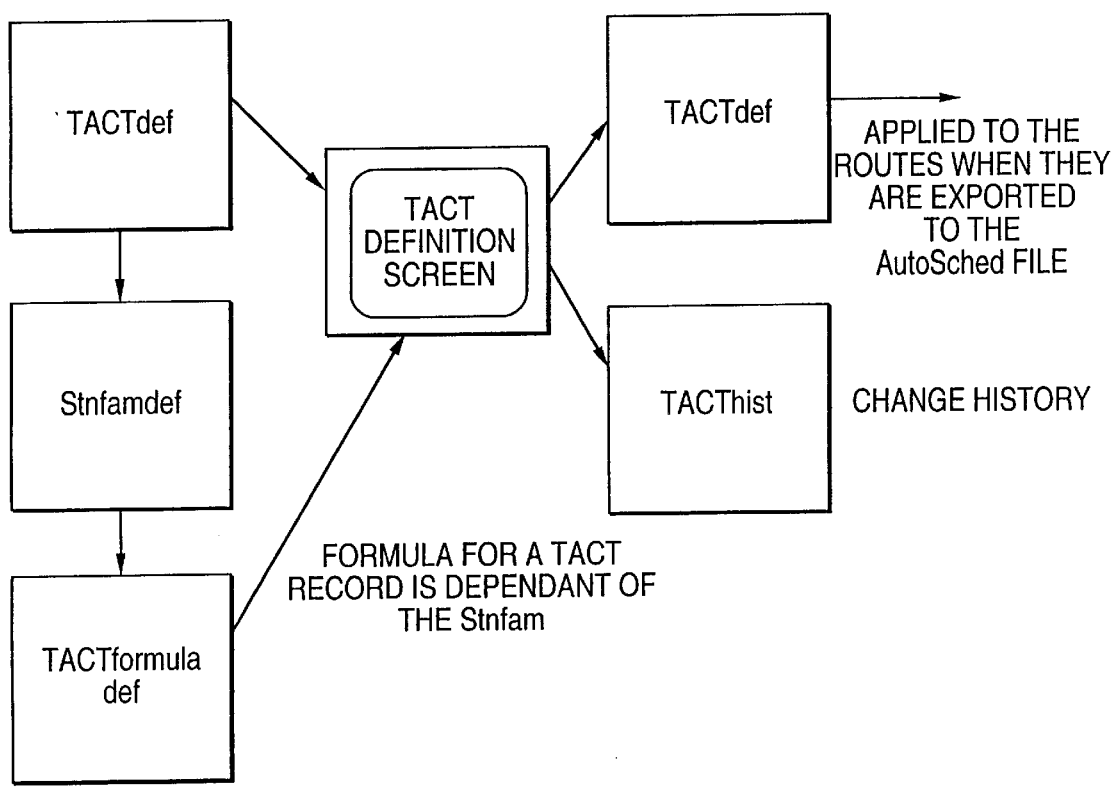
FIG. 8 is a block diagram of the machine tact modeler of the present invention.

The following describes the process and parameters of the machine tact modeler in detail with reference to FIG. 8.

TACT Processing

There are several components to the TACT feature.

TACT Definition The TACT Definition window manipulates the values in a "TACTdef" table. The TACT Definition window displays the "TACTdef", "TACTformuladef" and "stnfamdef" tables but can alter only values in the TACTdef table.

TACT Formula The "ptime", setup, "unsetup" and "lap times" are calculated using formulae defined in the TACTformuladef table which is maintained by the TACT Formula Definition window.

Stnfam Definition The TACT Definition window determines which formula to use for each TACT by accessing the "stnfamdef" table which specifies the formula to be used for each "stnfam".

TACT record keys

The TACTdef and TACTformuladef tables are not model dependent. The stnfamdef table is model dependent. The stnfam definition for the current model will be used to determine the TACT formula.

Each TACT record has a usage flag which can be set to PRODUCTION, NEW, or SAVE. A given record (unique over the keys) can only appear once with the usage flag PRODUCTION or NEW, i.e., if there is a PRODUCTION record, there cannot be a NEW record. There may be as many records as desired with the usage flag of SAVE whether or not there is a PRODUCTION or NEW record.

When a record is generated automatically using the Add Records function that scans the routes, the new records are given a usage flag of NEW.

When a route is exported to Auto Sched. each step will obtain its TACT times from the corresponding TACT record with a usage flag of PRODUCTION or NEW. Records with a usage flag of SAVE are ignored.

Changing the formula used and formula itself

When the formula associated in with a "stnfam/Eq" Type is changed in the "stnfam" definition or the actual formula is changed in the TACT Formula Definition window, the user must go to the TACT Definition window and regenerate the TACT values. Otherwise, they will have no effect on the routing. The calculated values are stored in the TACTdef table and used during route export.

TACT Formula Definition Window

This window as shown in FIG. 7 defines the formulae for the TACT calculations. It is referenced by the Stn Definition window and used to calculate times for all stations in that stnfam. It displays one master record at a time.

Each TACT formula definition contains expressions for the following fields:

Process time

Setup time

Unsetup time

Lap time

The formulae are used to modify the data window ("DW") with the PowerBuilder ("PB") Modify( ) function and must follow the DW expression syntax. The user can use any expression or formula that can be placed in a computed field in a DW. Do not use single quotes ('), use double quotes or tilde(~) instead. Only fields on the same row in the TACT definition table can be used. The actual names of these fields appear on the column headers of the TACT sample provided for verification purposes (in parentheses where different from the formatted name). It is possible to call user defined functions also. These must be PB global functions created with the PB Function Painter. The field names are not case sensitive. e.g.

T21+T3−ceiling(T0)

T21/2+(T1−T22)

if (left(stnfam, 3)="1PC", T1+T22, T1+T23−0.25)

The user can test the formula on the sample TACT definition by clicking the verify button. The user can alter the TACT values to check that the formula performs correctly. The PowerBuilder Reports Manual defines the functions that can be used for reports and hence in the Modify( ) function. The Data Window painter also lists them.

Changing a formula

The TACT must be recalculated when a formula is changed. A Recalculate button is provided on the window to perform this function. It will invoke the TACT Definition window and automatically 'click' the "Recalculate all TACT in TACT def" Button. If this is done manually by pressing the Recalculate button directly on the TACT Definition window, the system must ensure that the retrieval was performed after the formula was saved to the database.

Deleting a formula

When deleting a formula, the TACT must be re-calculated. Again, the "Recalculate all TACT in TACT def Button" on the window is used.

If a formula is deleted, the stnfams/Eq types that reference it will be wrong. This will be apparent on the TACTdef window when a Recalculation is attempted. The TACT formulae references must be altered manually through the Station Definition window.

Verify Button

This applies the current formula to the values in the Test Data window. The values in the test window can be changed to perform tests but are not saved.

Recalculate all TACT in TACT def Button

This button opens the TACT Definition window and automatically 'clicks' the ReCalculate button to recalculate all of the values. The result must then be saved in the TACT Definition window. The window can be used as it would be when opened from the menu.

Station Definition

Changing the formula associated with a Stnfam/Eq Type

If the formula associated with a stnfam is changed or a different formula is selected, the TACT must be re-calculated. Go to the TACT Definition window and click the Recalculate button. Ensure that the retrieval was performed after the stnfam changes were saved to the database.

Deleting a Stnfam/Eq Type

The TACT records that reference this stnfam will be wrong. This should not be done unless a route does not reference the stnfam either. The Delete Records button on the TACT Definition window will purge TACT records no longer referenced by the routes. Alternatively, the usage flag can just be changed to 'SAVE' or the records deleted manually. If they are just left there, they will not cause any errors provided they are not referenced by the routes.

TACT Definition Window

As shown in FIG. 7, the records can be retrieved by stnfam or 'all'. They are sorted by stnfam and equipment program identification. New rows can be added, copied and deleted in the normal way.

Key fields cannot be null and empty fields are not supported. Because this is a legitimate situation in the TACTdef table, these fields are set to the literal string 'none'. If the user tries to make a key field blank, the literal value 'none' will be automatically placed there. This also applies to the matching fields in the Route Definition Window and this happens on import also. Stnfam should never be null.

The fields in the window grid are as follows. They are obtained by joining TACTdef and stnfamdef and only the TACTdef fields can be altered in this window.

| | |
|---|---|
| Useflag | PROD, NEW, SAVE |
| Stage | (Key field) |
| RecipeTitle | (Key field) |
| Stnfam | (Key field) |
| EquipmentProgId | (Key field) |
| ReticleId | (Key field) |
| t0 | Times in floating point mins |
| t1 | |
| t21 | |
| t22 | |
| t23 | |
| t24 | |
| t25 | |
| t3 | |
| Batchqty | |
| Description | |

These fields are derived and cannot be altered directly on the window

| | |
|---|---|
| Formula | Formula associated with the stnfam. |
| Process time | Calculated by Formula |
| Setup time | Calculated by Formula |
| Unsetup time | Calculated by Formula |
| Lap time | Calculated by Formula |
| Cycle | Sum all t |
| CycleT0 | Cycle - t0 |
| Machine | (Sum all t)/batchqty |
| MachineT0 | Machine - T0/batchqty |

ReCalculate Button

This button recalculates each TACT by applying the appropriate formula to each row to recalculate the ptime, setup, unsetup and lap times. This is only required if the Stnfam or TACTformula definitions are altered. When the values on a TACT record are changed on a row, these values are recalculated automatically. The exception is when Copy Down is used. In this case, the values are not automatically recalculated and the user will be warned to do it manurally. The data must be saved after a recalculation because it only changes values on the local PC window.

If there are errors because a stnfam or formula cannot be found or is invalid, a row will be inserted into the error window that will appear. The user double-clicks on the error row to automatically move to the corresponding TACT record that is in error.

Add Records Button

This function scans all routes in the current model and adds a TACT record for any step/operation that does not have a match with a record in the TACTdef table with a usage flag of PRODUCTION or NEW. The new records are inserted directly into the database so a Save is not required. They are then retrieved to the window. They will have the usage flag set to NEW.

Discard Records Button

This is the opposite of Add. It scans all routes in the current model and deletes every TACT record that does not have a match and does not have the usage flag set to SAVE. The records are deleted directly from the database and a Save is not required. The TACT records are then retrieved to the window.

Tact Formula Def Button

This button is a quick way to bring up the TACT Formula Definition window. It is exactly the same as clicking the menu item.

Adding new records

New rows can be added in the normal way. The record must reference a stiff that will then pick up the appropriate formula. The window will automatically fetch the formula for that stnfam and calculate the TACT times. Recalculation is not necessary.

Save

This is performed in the normal way by the Save menu item or toolbar.

Changing the keys in TACTdef

If any of the key fields are changed, the record effectively becomes a new record and the above will apply.

TACT History Report

Every change to the TACT Definition is recorded in a TACT history table. There is a report to view the history in the Reports menu. It is not model dependent. History before a specified date can be purged using the function on the window. The date is in yy/min/dd format.

The Effective date column gives the time at which the change was performed.

Kanban Design Module

As described previously, scheduler database 30 has stored therein kanban worksheets used by scheduler 32 to perform simulation runs on production model. The integrated scheduling system of the present invention includes a Kanban Design Module to create these kanban worksheets. Unlike prior art kanban systems that use manual kanbans which require dedicated human resources, the Kanban Design Module of the present invention creates virtual kanbans what are incorporated by scheduler 32 when creating dispatch lots for manufacturing execution system 20 to use.

The Kanban Design Module of the present invention allows a user to design a kanban system per process flow according to kanban modules' definition and number of cards to meet required fabrication output and performance. The produced kanban worksheet is used to estimate suggested steps where the kanban stages start and end as well as the number of kanban cards for the stage. The user can manually modify the start and end locations as well as the number of kanbans by entering an adjustment factor. FIG. 9 shows a sample graphical user interface screen for monitoring and modifying kanban information.

The Kanban Design Module of the present invention is described in detail herein with reference to FIG. 10.

Kanban Processing

The kanban maintenance feature provides a tool to create kanban stages using algorithms developed by Sony. To enable an autoschedular such as, AutoSched for example, to use kanbans, each kanban stage must be defined in the "kanban.txt" file. Each step in a route that is in a given kanban stage must have the kanban name placed in the kanban field in the "route.txt" file. In the database, these files are represented by the "kanbandef" and "operdef" tables. This implementation produces kanban definitions for a device rather than a route and the kanbans are applied to all routes for that device on the assumption that the essential stages will be the same. The kanban stages are applied automatically to a route when it is imported from an MES such as a PROMIS. To facilitate this requirement there is an additional table in the database called "kanbanxref". This table stores the kanban stages for a device.

The step names in the PROMIS routes may vary even though the structure or the route is not really affected. To achieve consistent kanban stages in this situation, a step is uniquely identified by the stage and kanban index which are supplied by PROMIS and stored in the "custm13" and "custm12" fields in "operdef". The primary key in the kanbanxref table is the route, stage and kanban index.

Kanban WorkSheet Window

As shown in FIG. 9, this window aids the user in calculating kanban stages for a given device. It populates the kanbandef and kanbanxref tables with the kanban stages generated for a device. It can also update all of the routes for the device with the new kanban stages.

Route Selection

Select a route from the selection window. The steps of the route will be displayed along with the lap times calculated from the TACT Definition. If there is already a kanban definition for this device in the "Kanbanxref" table, it will be applied and the markers showing the stages will be displayed along with the kanban stage names and qtys. They are read from Kanbanxref, not the kanban stages in the route, although they should be the same. It is possible that the kanban stages defined in the Kanbanxref table do not match the stages and kanban indices in the route that is selected because they were generated against another route. If this is the case, a warning message will be displayed when the start or end of a kanban stage cannot be located. The user will then be prompted to decide whether to try to apply the rest of the kanbans or give up. Either way, the problem kanban will be ignored.

The device for this route will be displayed and whether this route is the active route for the device. A route that has no device ( the device is in the "Partdef" that references the route) cannot be selected because the resulting kanbans could not be saved since the device is a key field in the kanbanxref table.

A kanban stage cannot start on an alternative step. An alternative step must be included in the same kanban stage as its primary step. This is taken into account when automatically generating kanban stages.

The TACT time for an alternative step must not be used in the kanban calculations because it will only be performed instead of its primary step. Therefore, the Target Lap Time is set to zero for all alternative steps. Alternative steps are highlighted in Cyan on their row.

Master Fields

A change to any one of these fields (changes are accepted when the user tabs off the field or clicks on some other area of the window) causes the values in the route data window to be recalculated.

Setting Kanban Stages

The kanban stages are marked by setting markers at the right edge of the data window.

| | |
|---|---|
| Begin kanban stage | Click on row |
| End kanban stage | Shift-click on row |
| Single step is a kanban stage | Click on row to make it a start of a stage Shift click on same row to make it an end also |
| Remove marker | Clicking on a row with any marker will move the marker |

Set Formulae Button

This will recalculates the values in the DW. This should not normally be necessary because they are automatically recalculated anyway. It is primarily there for peace of mind!

All Steps

This will clear all existing markers. A kanban stage is then created for each step by placing markers beside them. Alternative steps are taken into account. This does not update the database.

Calc Stages

This will clear all existing markers. The kanban stages are then automatically calculated based on the Interval. The system will scan down the steps and set the kanban stages at the points where the Cumulative Target Days column changes to the next Interval increment (e.g. if the Interval is 3, the first Kanban stage will start at the first step and end on the last step that has a value of 3. The next stage will start on the first step that has a value of 4 etc.) Markers are placed by the steps. Alternative steps are taken into account. This does not update the database.

Clear Button

This will clear all kanban markers from the indicator column. This does not update the database.

Calc Kanbans Button

When the markers have been positioned either automatically, manually or both, this function will assign a name to each kanban stage and calculate the kanban qty. The name and qty only appear on the row that starts the kanban stage. The user may edit the kanban names and change the Adjusted Qty by changing the Management Factor on the start row for the stage. Do not alter or add to rows that are not at the start of a kanban stage, they will have no effect. This does not affect the database.

Save Kanbans Button

This saves the kanban stages to the database. It first deletes the records for this device from the Kanbanxref and Kanbandef tables. It then saves the new kanbans to these tables. The Save function in the menu and the toolbar will do this also.

The kanbandef table records are created as follows:

| | |
|---|---|
| Kanban | K - <Device>,-N |
| Wkanbantype | Lot |
| Wkanbanatt | Anumpieces (default) |
| Wkanbanrule | rulek - FIFO (default) |
| Pkanbanqty | Adjusted Kanban Qty |
| Wkanabanqty | 1 |
| Pkanbantype | Lot |
| Pkanbanatt | blank (default) |
| Pkanbanrule | blank (default) |

The user will be prompted to update the routes for this device. Choosing "Yes" is the equivalent of clicking the Updates Routes Button.

Update Routes Button

This will update all of the routes for this device with the new kanban stages. It will update the route that is displayed first and then go through each route in turn. The microhelp at the bottom of the frame shows how may routes and which one is being processed. The routes are updated by being read into a hidden data window, updated and then written back to the database.

If there is a problem in a route, the process will stop. However, any routes that have already been processed will have been updated in the database with the new kanban stages. A warning message will be displayed that gives the name of the route being processed and the kanban, stage and kanban index that could not be found in the route and whether it was the start or end of the kanban stage. The error indicates that this route does not have the same stage/kanban index as the route used to generate the kanbans. If the problem is not obvious from the message, the user may the problem route as the route to apply the kanbans against. When the route is retrieved, the kanban indicators will be set and it will be easy to see where the problem stage is.

Calculations and Default Values

| Master Fields | |
|---|---|
| Name | Default |
| Multiplier | 1 |
| Required number of wafers out | none |
| Interval (days) | 1 |
| Standard lot size | 25 |
| Plan days in the month | 30 |

The following display only fields are also included:

| | |
|---|---|
| Device | Device the route is for (from partdef) |
| Active Flag | Indicates if this is the active/latest route (from partdef) |
| Number of Steps | Number of steps in the route |
| Number of Kanban Stages | Number of kanban stages. (calculated on retrieval and Calc Qtys) |

| Table fields | |
|---|---|
| Stage | PROMIS stage |
| Step | Step |
| Equipment Prog Id | Setup |
| Lap time | Calculated from TACT (hrs) |
| Target Lap time | Lap Time*Multiplier/24 (days) |
| Cumulative Target Days | Ceiling(Sum(Target Lap Time)) |
| Standard WIP | Target*Daily throughput (Daily throughput = Required wafers out/Plan days in month) |
| Standard WIP in lots | Standard WIP/Standard Lot size |
| Cumulative Lots | Running total of Standard WIP lots |
| Kanban qty | Ceiling(sum of standard WIP in the kanban stage / Standard lot size) |
| Manager Factor | Input by user. Defaults to I |
| Adjusted Kanban qty | Kanban qty * Manager Factor (qty used for kanban) |
| Kanban name | Name of the kanban stage. (on the first row of the kanban stage) |

The Manager Factor can be set for each Kanban by the user and is defaulted to 1. The user may alter the Kanban stage names if desired.

Kanbanxref Definition

This window displays the Kanbanxref table created by the Kanban Worksheet window. It is included for completeness but should not normally be used because it is difficult to manually correlate all of the values with the other tables.

The selection displays a list of devices from the Kanbanxref i.e. existing Kanbanxrefs. The grids in ME datawindow displays a list of devices from Partdef i.e. all valid devices in the model. This gives you the ability to add new Kanbanxrefs if desired. Values in this table are applied to the routes when they are imported from an MES such as a PROMIS.

SaveAs

SaveAs on this window works differently to other definition windows because this data is never explicitly sent to AutoSched. SaveAs will just save the currently displayed dataset in the format that you choose. This is similar to SaveAs on reports.

Kanban Definition

This is a standard window that manipulates the kanban table.

EXAMPLE

The following is an example of the integrated scheduling system of the present invention. By way of example only, a manufacturing execution system by Promis Systems (PROMIS) was used in conjunction with an autoscheduling system by AutoSimulations, Inc. (AUTOSCHED) connected to a publishing/subscribing message bus architecture to implement the integrated system of the present invention.

Transaction Processing and Schedule Display Subsystem Dataflow

Control Interface

The data will be sent from PROMIS to the database Client in two passes, approximately every 3 hours, which will be configurable at the PROMIS side. These passes are called:

| T1 | Static data | (equipment, devices, routes, layers, clusters.) |
|---|---|---|
| T2 | Status information | (WIP status, equipment status, PM counts, PM Orders) |

The T1 pass will send all the static data that has changed since the last time it was sent. This will be done early enough to give the database Client time to process it before the status information is sent at T2.

The schedule will be run immediately after the T2 data has been imported into the database. Any number of T1 downloads (or none) may be performed before a T2 download.

Initiating PROMIS extraction

The regular T1 and T2 extractions will be triggered by a process on the Manufacturing Execution System 20. An asynchronous extraction will be triggered by a PROMIS command menu with suitable privileges required. This will do a T2 extraction which automatically reloads any T1 data required.

The extraction process will first check to see that the control file that it writes at the end of the extraction has been deleted by the database Client import process. If not, the previous data has not yet been imported and it will not be overwritten. It will then output flat files to the HP/ORACLE machine via the TIB. When the transfer is complete, the process will write out a control file that the import process can look for. The database Client import process will poll for the files indicating the completion of the T1 or T2 run. It will then read the data files and load them into the buffer tables in the database. In T1 or T2 downloads, the database Client reads all the files that have been sent for that type of download. Files may be omitted with no problem e.g. a T2 download may omit the Equipment files if nothing has changed. In the first implementation, all the T1 files will be sent at T1 and all the T2 files sent at T2.

The control file names are:

t1complete_prod1a.dat t2complete_prod1a.dat

Debug information may be placed in the control files but the HP Schedule database import process will not look at what is in the file, only at whether the file exists.

When the T1 or T2 data has been successfully imported into the database the database Client will delete the control file. When the control file has been deleted, PROMIS is free to perform the next data extraction.

In the steady state, the database Client is looking for both T1 and T2 control files. After a T1 import, it continues to look for both T1 and T2 control files so that another T1 could be performed if desired before a schedule is run. A successful T2 import always triggers a schedule run regardless of whether there has been a T1 import since the last schedule run.

There is a table called "Triggerstat" in the database that will be updated with the times of the data import. This can be viewed in an on-line report screen.

Error situations

T1 and T2 downloads will be blocked if the control files are not deleted for any reason.

PROMIS Import Window

There will be a window that allows the user to import the PROMIS data under manual or automatic control.

The automatic mode will be started by a button on the PROMIS Import screen. This will automatically create an instance of the Schedule Execution screen. It will then start to poll for the creation of the T1 and T2 control files on the host. The poll rate is configurable from the Setup button but cannot be less than 10 secs.

When the T1 and T2 control files are detected it will perform the import process as described above. When a T2 import process is complete it will initiate the schedule run. It does this by executing functions in the Schedule Execution screen. This screen will retrieve the model data from the database and assemble it in datawindows in the correct format for the asd files. It will then create each file in a local directory on the PC. It then copies all of these files to the ".asd" directory on the Autosched host using ftp.

When the files have all been copied to the host, a schedule run request is made to the Queue Manager (QM). (The QM is a daemon process that runs continuously on the host.) This is done by creating a directory under the QM directory on the host and placing various control files there. The QM polls for the creation of these files and will then execute the schedule. The database Client will then poll for the schedule completion or failure by looking for control files created by the QM. When the run has completed, the database Client will import the schedule file (modelname.sch) into a data window and process it. The data will then be written to the as-schedule file with the new schedule name and model name as the key.

The Dispatch List will then be created in a Lotstat table. The Lotstat table which contains one record for each lot is then deleted and re-created from an Orderstat table that was used to create the new schedule. If a lot is in the waiting state, the next step/stn fields are set up from the new schedule. All of the transactions that happened since the start of the T2 extraction will then be reapplied to Lotstat to bring it up to date with the current PROMIS status.

Manual Mode

The PROMIS Import screen can be used in manual mode, to import each dataset individually and break the import sequence down into its component parts:

a) ftp files from HP to PC b) Read data into database buffer tables c) Process data in the buffer tables and populate the definition tables The user can also enable audits in the import functions where they exist.

Import Setup

The Ftp name, login and password for the PROMIS data import may be different to that of the scheduler. The scheduler may be run on the same host under a different login or on a different host. The scheduler parameters are setup via the Host Definition and Model Properties screens. There will be a setup button on this screen that allows the user to specify these parameters and also the T1 and T2 directory paths and the poll rates. The values will be stored in a file called Import.ini on the PC.

Data Interface

The following datasets will come from PROMIS at time T1 and T2. In general, T1 data will only be sent if there has been a change since the last time it was imported into the database. T1 data may also be resent at T2 if there is a change between T1 and T2. The T2 data will be imported in its entirety at T2 regardless of what has changed.

Data sent at time T1

Station Families

Stations

Clusters

Parts

Layers

Routes

Data sent at time T2

Lots/WIP Status

Station Status

PM Counts and Limits

PM Orders

Locking and Concurrency

The data from PROMIS will be written into buffer tables, not directly into the Schedule database tables. The reasons for this are:

a) The number of fields that the PROMIS import fills in for a given record is small in relation to the total number of fields. A buffer table eliminates the need for the interface to know what all the fields and their defaults are.

b) Buffer tables isolate the PROMIS interface code from changes to the Schedule database.

c) Buffer tables simplify locking and Concurrency.

d) Buffer tables allow additional checks and processing to be easily added because they will processed by Power-Builder functions.

When buffer tables are being populated, only the import interface will be using them. When the import of that dataset is complete, the import process will update the trigger flag in the Trigger table and will execute a PB function to update the target database tables.

Due to performance considerations, the Route import uses a different procedure. The T1 file is imported into a data window and then the data window is passed the route import function which processes it directly and writes the data to the route and operdef tables. This reduces the processing time by omitting the buffer write which is insignificant for the other tables.

When the database procedure updates a target database table from the buffer tables, the following procedures will be followed:

Optimistic locking is used throughout the system. When a record is updated, a field called "updateval" is incremented. This field is used as a key in the SQL WHERE clause, so that if another user alters the record and writes it back, the user's update will fail because it will not be able to find the record it is updating. Where there are multiple records in a dataset (e.g. Routedef, operdef, operoperatorxref, opertoolxref), the updateval in the "master" record is always updated if any detail record is updated, added or deleted. So any change is a change to the whole route.

When a change is saved, all tables involved are write-locked briefly. The updating process will wait on a write lock request until it is granted which will be in a few moments if all other processes are following the strategy. To avoid deadlocks, the correct locking order of tables in a Multi-State Transaction (MST) must be followed.

If a user is updating a table at the time the database procedure runs to populate the database Client, the following results may occur. A user should only be updating certain default fields in the dynamic tables. Changes to datasets such as WIP will be lost every time the import runs. Changes to data sets such as Routing will be lost every time they are reloaded.

a) User has table open for edit and the database procedure starts and completes before he saves his changes. Any changes to records that the database procedure has updated will be lost because he will not be able to save them. He will get a suitable warning when he selects Save.

b) User tries to save his changes before the database procedure changes the records he is working on. His change will work but may be overwritten by the import process. He will not get a warning. If the record existed for him to update it in the first place, the database procedure will probably only have performed an update on the dynamic fields and he should only be changing the static and lookup fields, so his changes will not be lost. He should not be changing dynamically updated fields.

A screen will be provided in the utilities menu to allow the user to view the Trigger table. This will provide an idea of when the last import occurred and whether one is progress.

When a dataset has been loaded into the buffer table, the import process will update the appropriate record in the Trigger table by setting its trigger flag to "Y".

| Triggerstat | |
|---|---|
| Field | Comments |
| Dataset | |
| Triggerflag | Y when import complete |
| Triggertime | Information only, time when flag was set |
| PPCompletetime | Information only, time when post-processing completes |

Valid Dataset names are:
STN
STNFAM
CLUSTER
PART
LAYER
ROUTE
WIP
STNSTAT
PMCOUNT
PMORDER
T1COMPLETE
T2COMPLETE Buffer Table File Names The T1/T2 file names will be of the form:

prod 1a__<dataset name>.dat.

The dataset_name is in lower case.

Table Maintenance

The imported data will create or modify records in various tables. In many cases, it is neither possible nor desirable to automatically delete records from tables just because the model does not appear to use them. In these cases, the data must be managed manually. See below for a details of where this applies.

Log File

A log file will be kept on the PC to record major events and errors.

Action on Import

When a data set is imported from a PROMIS file, the data may be used to update existing data or it may completely replace the data set. The following table summarizes this.

Delete all the existing data is deleted from the production model and replaced with the new data Insert records received from PROMIS that do not currently exist in the production model are added to the database Update if the record received from PROMIS currently exists in the database it will be updated with the data from PROMIS.

| Data sent at time T1 | |
|---|---|
| Stnfam/Equipment Type | Insert, update |
| Stn/Equipment Id | Insert, update |
| Clusters | Delete |
| Parts | Insert, update |
| Layers | Delete |
| Routes* | Insert, update |

*Routes are treated as an entity. When a route is received from PROMIS, the import process will delete the route and all of the steps if the route already exists and then replace it with the new one. New routes will be added, routes that do not have a replacement will not be deleted.

| Data sent at time T2 | |
|---|---|
| Lots/WIP Status | Delete |
| Station Status | insert, update |
| PM Counts and Limits | Delete |
| PM Orders | Delete |

*Routes are treated as an entity. When a route is received from PROMIS, the import process will delete the route and all of the steps if the route already exists and then replace it with the new one. New routes will be added, routes that do not have a replacement will not be deleted.

* Routes are treated as an entity. When a route is received from PROMIS, the import process will delete the route and all of the steps if the route already exists and then replace it with the new one. New routes will be added, routes that do not have a replacement will not be deleted.

T1 Data Import

Stations/Equipment

The information that comes from PROMIS at T1 will be mapped to two buffer tables as follows.

| StnBuffer | |
|---|---|
| Field | Comment |
| EquipmentType | stnfam |
| EquipmentId | stn |

| StnfamBuffer | |
|---|---|
| Field | Comment |
| EquipmentType | stnfam |
| PROMISlocation | PROMIS location (Area) |
| PMRule1 | PMRule1 |
| PMRule2 | PMRule2 |
| PMRule3 | PMRule3 |

Details of Mapping

This information populates two tables in the Schedule database, stnfamdef and stndef. When this data is received, existing records will be updated or new ones added.

Stndef

If stnfam is changed, it must be in the stnfamdef table. A new record will be inserted if not there.

If there is a new stn, a record will be added plus a record for stnfamdef if it does not exist.

No existing records will be deleted. Records are added or modified.

Stnfamdef

There must be a record for each stnfam referenced by the stndef table. It is valid to have an stnfam without any stns, as could happen in manual input.

No existing records will be deleted. Records are added or modified. No audit capability will be provided. The tables can be manipulated using the standard screens where deleting a stnfam deletes all the associated stns. The additional fields below must be populated manually.

Additional fields

There will be a field that will provide the default value for ptper in each step record in a route that uses this stnfam. This will be mapped to a custom field in stnfamdef There is also a field that references the TACT formula to be used to calculate Ptime etc. for steps using the stnfam. The PMRules will also be stored in stnfamdef

| Stnfamdef | | |
|---|---|---|
| Field | Description | Default |
| Ptper | Ptper | "Lot" |
| TactFormula | Formula for TACT | CONSTANT |
| PMRule1 | PM Rule1 | empty |
| PMRule2 | PM Rule2 | empty |
| PMRule3 | PM Rule3 | empty |

Clusters

The information that comes from PROMIS at T1 will be mapped to a buffer table as follows. If there are any changes to this table the entire table will be downloaded from PROMIS at T1.

ClusterBuffer

Cluster

EquipmentId

ActiveFlag (Y/N)

Details of Mapping

In the AutoSched ("AS") model, all steppers are grouped into a single stnfam. The cluster table groups them in a different way and custom AS code uses this table to decide what stepper to use for a lot and step. If a lot starts out using a stepper in clusterN, it must always use a stepper clusterN for all of its stepper operations. It is therefore an attribute of the lot.

All existing records will be deleted at the start of the import process.

Parts/Devices

The information that comes from PROMIS at T1 will be mapped to a buffer table.

| PartBuffer | |
|---|---|
| Field | Comment |
| PartId | Partname in partdef |
| Device | Mapped to a custom field in Partdef (custm11) |
| ProcedureId | Routename in partdef |
| Process | PROMIS Process name for the device (custm10) |
| pgd | 0 initially, manually maintained (custm12) |
| custm9 | Y/N the active route for this device (custm9) |

Details of Mapping

The Part definition is essential in AS because a lot makes a part which references a route. There is no direct link between lot and route. This is an issue because there could be two lots making the same device that are using different routes. The solution is to map the AS Part to the PROMIS Part identification and add an extra device field to the Partdef table to store the device. The device name will be a concatenation of the Part ID and Primary Procedure ID. There is an explicit field for the Primary Procedure ID which is the AS route for this part.

| PROMIS | AS | e.g. |
|---|---|---|
| Part id | Partname | K-1053.02_K-1053.9 |
| Device | Custm11 | K-1053 |
| Procedure Id | Routename | K-1053.9 |
| Process | Custm10 | |
| ActiveFlag | Custm9 | Y or N |

Manually updated fields

| Field | Default | Comment |
|---|---|---|
| dfltld | 0 | default lead time fields |
| dfltldu | secs | units |
| Custm 12 | | pgd for Common database. Will be downloaded from PROMIS but will be 0 initially so must be manually updated. |
| Custm 13 | | fin Good 1 for Common database |
| Custm 14 | | chip Size 1 for Common database |
| Custm 15 | | chip Size W for Common database |

The part record must be edited by hand to add the default load fields. If the part record does not exist in the table a record will be created with defaults for the default load values.

No existing records will be deleted. Records are added or modified. No audit will be provided.

Layers

The information that comes from PROMIS at T1 will be mapped to a buffer table as follows. If there are any changes to this table the entire table will be downloaded from PROMIS at T1.

| LayerBuffer Field | Comment |
| --- | --- |
| LocationName | (not passed through to AS) |
| Layer | Key field |
| EquipmentId | |
| ActiveFlag | I/A/M |
| Process | Key field |

Details of Mapping

The layer name is related to a stage in the routing in which there is a stepper step. The layer table indicates which steppers can be used to perform a given layer in a given route. Therefore, when a stepper stn is looking for a lot to process, the lot must be for the same cluster as this stepper and the layer to be performed must be valid for this stepper to do.

All existing records will be deleted at the start of the import process.

Routes

The routing information adds records to the Routedef and Operdef tables. There is one record per route in Routedef. There is one record per step in Operdef. The Routedef and Operdef records will be created from the PROMIS data plus a number of lookup tables.

There will be a flag in PROMIS that will allow the user to say which Routes should not be included in the extraction. This will allow the user to stop the extraction of engineering and test routes which may change often but which are not needed for scheduling.

| RouteBuffer (one record per step) Field | Comment |
| --- | --- |
| Route | primary procedure id |
| Step | unique name generated by PROMIS |
| EquipmentProgId | setup |
| ReticleId | |
| RecipeTitle | e.g. OXIDATION, PRETREAT |

| RouteBuffer (one record per step) Field | Comment |
| --- | --- |
| StageId | stage |
| Alt | Y = Alternative step (N or empty otherwise) |
| ASSpecProc | Y = special processing e.g. Wet Stn, N otherwise |
| RecipeId | |
| EquipmentType | stnfam |
| StageLocationId | process location (set) |
| Subset | PROMIS stage + device |
| Fab | superset |
| KanbanIndex | When combined with Stage, this provides a unique index to a step but will be more static than the step name. |
| PMrule1arg 1 | Arguments for PM rules |
| PMrule1arg 2 | |
| PMrule1arg 3 | |
| PMrule2arg 1 | |
| PMrule2arg 2 | |
| PMrule2arg 3 | |
| PMrule3arg 1 | |
| PMrule3arg 2 | |
| PMrule3arg 3 | |

Note: Step names should be unique within a route including the names of alternative steps. The combination of Stage and Kanban Index should be unique within a route.

Details of Mapping

When a route is received from PROMIS, the existing route of the same name will be deleted. This includes the Routedef record and all associated Operdef records. For completeness, the records in other tables associated with a route will be deleted. They are Operoperatorxref and Opertoolxref that define operators and tools required for a step. The new route records will then be inserted. No routes will be deleted in this interface except for ones that are being replaced. No audit will be provided.

When the routes are exported to the scheduler, some other fields are modified automatically based on values in the TACTdef table and other values in the routing. This ensures that TACT changes are picked up as on the next schedule run regardless of whether there is a T1 import.

PROMIS will generate a field called ASspecproc that is a string to indicate that the import code has to do some special actions on the step. The only one identified so far is Y to indicate a Wet station step. The fields in the Operdef records are generated by the PB function as follows. Any field not listed will be given a default of blank/null.

| PROMIS | database Client | Comments, examples |
| --- | --- | --- |
| primary procedure | routename | |
| unique name generated by PROMIS | opername | step |
| stage | custm13 | |
| equipment type | stnfam | |
| — | ptper | depends on equipment type copied from stnfamdef table |
| equipment prog id | setup | required setup for this step |
| — | when | Defaults to "Need" |
| recipe title | operdesc | e.g. OXIDATION, PRETREAT |
| — | agenda | from lookup table RouteParamDef |
| asspecproc | — | Y or N (not copied to operdef) |
| combine | combname | from lookup table RouteParamDef |
| stage location id | set | process location |
| fabname | superset | Fab1A |
| PROMIS Stage+PROMIS device | subset | |

-continued

| PROMIS | database Client | Comments, examples |
|---|---|---|
| recipe id | custm 14 | |
| reticle id | custm 15 | |
| — | rework | Rework is defined for Wet stations only. 100% the whole lot goes to rework |
| — | rwkrtepart | 'R'+stnfam+equip prog id |
| — | rwktype | Lot |
| — | rwkstep | 1 |
| — | rejoin | Next step in the route |
| — | stnexec1 | from lookup table RouteParamrDef |
| — | stnexec2 | from lookup table RouteParamD)ef |
| — | stnexec3 | from lookup table RouteParamDef |
| — | stnexec4 | from lookup table RouteParamDef |
| — | stnexec5 | from lookup table RouteParamDef |
| — | stnexec6 | from lookup table RouteParamDef |
| — | batchcrift | from lookup table RouteParamDef |
| — | batchmn | from lookup table RouteParamDef |
| — | batchmx | from lookup table RouteParamDef |
| — | kanban | from lookup table KanbanXref |
| PM rule 1, arg 1 | custm 1 7 | Arg1 for rule 1 |
| PM rule 1, arg 2 | custm 18 | Arg2 for rule 1 |
| PM rule 1, arg 3 | custm 19 | Arg3 for rule 1 |
| PM rule 2, arg 1 | custm20 | |
| PM rule 2, arg 2 | custm21 | |
| PM rule 2, arg 3 | custm22 | |
| PM rule 3, arg 1 | custm23 | |
| PM rule 3, arg 2 | custm24 | |
| PM rule 3, arg 3 | custm25 | |
| KanbanIndex | custm 12 | Kanban index |

Note: ptper, ptime, setup time and unsetup time are set during the export of the data to AutoSched.

Rework and Split Steps

The simulation will never split a lot or move a lot or split to a rework route on a statistical basis except where reworks have been used to model "normal" flow. e.g. WET stations. The lot status from PROMIS will include splits and lots in rework. This information has to be added to the internal Lot load record in AS and need not appear in the route. The only information pertaining to these situations that has to be in the route is the points at which Lots combine after being split. These points are defined in the Routeparamdef tables with the combinename field. The combinename is not really necessary as one will be created and added automatically by the WIP import if needed.

Wet Stations

Where a WET station is modeled by a rework route, the rework fields will be filled in as follows:

| | |
|---|---|
| Rework | 100 |
| Rwktype | Lot |
| Rwkstep | 1 |
| RwkRtePart | R+stnfam+Equipment Program id |
| Rejoin | Next step that is not an alternative step (cannot rturn to an alt setp) |

Test Stations

For test stations, identified by stnfam=1PCTEST, the lot may be all or partially retested. The rework route will rejoin at the same step and the combine with the Parent lot (if any) there also, i.e., if test is at step 10, rework route is on step 10, rejoin is step 10 and combine is step 10. The combine name must be placed in the routing. Rejoin is not required as it will be a lot attribute.

There will be no rework steps passed in the routing between PROMIS and database Client. They will be maintained by hand in the database Client database. There will be alternative steps in the routing.

There will be a lookup table called Routeparamdef to populate fields in operdef.

| Routeparamdef Field | Keys | |
|---|---|---|
| stnfam | Primary Key | equipment type |
| recipe id | Primary Key | |
| equipmentProgId | Primary Key | setup |
| batchcritf | | batching fields |
| batchmn | | |
| batchmx | | |
| stnexec1 | | stn exceptions. Stops defined equipment ids from being used for the step |
| stnexec2 | | |
| stnexec3 | | |
| stnexec4 | | |
| stnexec5 | | |
| stnexec6 | | |

-continued

| Routeparamdef Field | Keys | |
|---|---|---|
| combine | | required if splits rejoin at this step |
| agenda | | in case agendas are needed in the future |

This table will not be updated automatically by the PROMIS interface. It will be maintained manually.

Kanban Insertion

The kanban rules are critical to the scheduling of the Fab. Kanban will be performed by step and every step in a kanban stage has to have the name of that kanban. The kanban information will be added to the route when it is imported. The information will be in a new kanban cross reference table called Kanbanxref The user will define the device, the begin and end stage of each kanban and specify the kanban name via the Kanban WorkSheet.

The kanban name will be written to each step in the route starting at the first step in the specified start stage and ending at the last step in the specified end stage. This will be done in the database procedure during the import of the routes or from the Kanbanxref screen when a change is made to the Kanbanxref table. Alternative steps cannot start a kanban stage and must be included in the same kanban stage as the primary step.

| Kanbanxref Field | Keys | Comments |
|---|---|---|
| Device | Primary Key | Part without the version suffix |
| BeginStage | Primary Key | Stagename in operdef |
| BeginIndex | Primary Key | Identifies the step within the stage |
| EndStage | | Stagename in operdef |
| EndIndex | | Identifies the step within the stage |
| Kanban | Foreign Key | Refers to standard AS Kanbandef table. |
| Seqval | | Sort order field |
| ManagementFactor | | The factor set by the user. Note that this is only saved for each kanban stage, not for each step. |
| Kanbanqty | | The kanban qty written to the kanbandef record for this stage |

Note: It will not be possible to have two different kanbans starting and ending at the same stages even though the groups referenced may be in different sections of the route.

Maintenance

The Kanbanxref table will be maintained through the Kanban Worksheet screen that will populate the Kanbandef and Kanbanxref tables and apply the kanbans to the steps in the routes. When a new route is imported, the system will apply the kanban stages as best it can from, the Kanbanref table. The assumption is that route changes will be minor with respect to changes in stages and steps that affect kanban. It will be up to the user to check the resulting AS route whenever there is a change. The combination of stage and kanban index is used instead of the step name. This is because the step names are rather fluid even though a change to a route might be minor.

T2 Data Import

Station/Equipment Status

The information that comes from PROMIS at T2 will be mapped to a buffer table as follows. The trigger can be set when the table has been loaded.

| StnStatBuffer Field | Comment |
|---|---|
| EquipmentType | stnfam |
| EquipmentId | stn |
| Down | See table below |
| Dwunttime | See table below |
| Cursetup | See table below |

Details of Mapping

The Status of each equipment id will be downloaded at T2. The data provides the status of the station and its current setup. The status is placed in the Down field whose meaning is described below.

The Down field combinations are as follows:

| Equipment Status | Down | Dwunt | Dwunttime | Units | Cursetup |
|---|---|---|---|---|---|
| up, active | 0 | — | — | — | Equip_prog_id |
| UP, idle | 0 | — | — | — | — |
| DOWN | 1 | — | — | — | — |
| Running PM | 3 | — | DateTime | — | — |

When DOWN=3, Dwunttime is the date/time at which the station will be back up. e.g. "11/27/95 12:03:00".

There should never be a situation where an equipment id is imported at T2 for which there has not been a record imported at T1. There will be an audit to check for and repair this is with a default record in stndef and stnfamdef if required but will not normally be enabled. The station will be defaulted to UP with no current setup.

Lots (WIP)

The information that comes from PROMIS at T2 will be mapped to a buffer table as follows. The trigger can be set when the table has been loaded.

| WIPStatusBuffer | |
|---|---|
| OrderName | Tilde character if lot is in storage Note 1 |
| LotId | Lot id |
| LotType | Lot type (2 chars) |
| PartID | Device + Rev concatenated with Primary Procedure ID |
| Qty | Qty of wafers in lot |
| Starttime | Actual start if lot is WIP or scheduled start otherwise |
| Duetime | NULL |
| AsSpeccProc | Y or N (e.g. Y for Wet Station) |
| LotStatus | 0-Normal, 1-Hold |
| CurrentStep | Current step or empty if not started |
| CurrentStage | Current stage or empty |
| CurrentEquipId | Current equipment id or empty |
| CurrentEquipType | Current equipment type or empty (also empty if lot is on hold) |
| RecipeId | Current recipe id or empty |
| EquipmentProgId | Not used, but may be needed later |
| TrackinTime | |
| Priority | |
| SplitFlag | Y/N |
| ReworkFlag | Y/N |
| ParentLotId | |
| CombineStep | For future temporary split processing |
| ClusterPhoto | Cluster names assigned to Lot |
| Cluster2 | |
| Cluster3 | |
| Cluster4 | |

Note: the first line of the file will contain a single datetime in the first column that gives the time of the start of the WIP T2 extraction. This will be the simulation start time.

The WIP file from PROMIS will generate the Orders for AS via the Orderstat table in ORACLE. The WIP file will be put into a buffer database table and then a function will run to process it into the Orderstat table. The main issue is dealing with lots that are currently split or being reworked.

Details of Mapping

The Orderstat file will be completely deleted by the database procedure. It will be recreated using the following data:

| PROMIS | AS | Comments |
| --- | --- | --- |
| String created by PROMIS from the scheduled start date. Should not have characters like colon or slash. | Ordername | If this is the tilde, the lot is in storage. The schedlevel field will be set to 10 to stop it being scheduled. |
| LotId | Lotname | |
| LotType | Type | |
| PartId | Partname | |
| Qty of wafers in the lot | Pieces | |
| If Lot is in WIP, then actual start date/time. Otherwise, scheduled start date/time | Starttime | |
| NULL Interface should extract the current value from PROMIS for possible future use | Duetime | |
| — | Trace | 3 |
| Lot Status | Hold | 0=Normal 1=Hold |
| — | Hldunttime | NULL |
| — | Hldunt | 0 |
| — | Hldunu | mins |
| Current step or empty | Curstep | |
| Current equipment id | Curstn | |
| Equip prog id | Custm9 | |
| Current equipment type | Custm 10 | |
| Current stage | Custm 11 | |
| Track-in time for this step | Stpst | |
| | Rem | 100% (default) |
| | Action | 1 |
| Priority | Prior | Lot Priority |
| Clusterphoto | Custm1 | Photo Cluster |
| Cluster2–5 | Custm2–4 | Future Clusters |

The determination as to whether the lot is in rework or a split will be determined as in the following table.

The way PROMIS defines a rework route is different to the way in which it is defined in AS. In fact, the lot performs a few extra steps and then repeats the steps in the route immediately before the rework. In PROMIS, the whole set of steps that the lot goes through is defined in the rework whereas in AS, only the extra steps are defined with the lot rejoining the route at a point where it can repeat some steps. Therefore, when a lot is in rework in PROMIS, it may actually be in the rework route in AS or repeating steps in the normal route.

e.g.

| PROMIS Standard | Rework | AS StandardRework |
| --- | --- | --- |
| Expose | | Expose |
| Inspect | | Inspect |
| | Strip | Strip |
| | Clean | Clean |
| | Expose | (rejoin route at Expose) |
| | Inspect | |
| Sem | | Sem |
| Etch | | Etch |

There are two cases:

a) the lot is on the PROMIS rework route on a step that is in the AS rework route.

b) the lot is on a PROMIS rework route but is really re-doing some steps. This is mapped to the original route in AS.

The recipe identification of a step on a rework route that is really a duplicate of the original route (because it is being redone) will be the same as the original step Find the corresponding step in the AS route

| Type | split flag | ework flag | Current step | Current stage | Recipe id | Parent lot | Equipment type |
| --- | --- | --- | --- | --- | --- | --- | --- |
| Single Lot/ Permanent Split | N | N | Current step in route (empty if not started) | Current stage lot is on | recipe id of current step | empty (n/a) | Equip Type |
| Lot on rework | N | Y | Current step in route | Current stage lot is on | recipe id of current step | empty (n/a) | Equip Type |
| Split Lot on rework | Y | Y | Current step in route | Current stage lot is on | recipe id of current step | Parent lot | Equip Type |
| Temporary Split | Y | N | Current step in route | Current stage lot is on | recipe id of current step | Parent lot | Equip Type |

```
Find the recipe identification in the standard route
If the step is found, the lot is on the standard AS route
        Current step is the step found
        Set Rejoin, RwkRtePart fields to blank in lot load
Else(the lot must be on an AS rework route, see if its RPRPBM)
        Look for step with same stnfam in the rework route RPRPBM (photo before
        metal)
        Current step in the AS rework route is the one whose stnfam matches the
        current equipment type Set NsRtePart = PRPBM
        Set curstep equal to this step
Else (the lot must be on an AS rework route, see if its RPRPAM)
        Look for step with same stnfam in the rework route RPRPAM photo after
        metal)
        Current step in the AS rework route is the one whose stnfam matches the
        current equipment type Set NsRtePart = PRPAM
        Set curstep equal to this step
End if
If on a rework route:
        Find the step to which the lot should return in the standard routing
        i.e.Find the step in standard routing with stagename = layename.PR reticle id =
        blank
        Set Rentry equal to this step
        alt <> alt
End if
```

Set the split fields in the load for this lot if it was split for rework
  If the lot is a split
  Find the step at which the parent lot is waiting. This is the combine step.

The logic for this situation is:

```
Ifcurrent station type = 1PCTEST and in rework
              Find the rejoin step
              set lot rejoin = rejoin step
              If lot is a split
                      Find the step at which the parent lot is waiting. This is the combine
                      step
                      Read the combine name from this step and place in lot split attribute
                      Add the split lot id to the parent lot linked list
              End if
      Else
              Normal Lot processing
      Endif
```

Read the combine name from this step. The splitname must be set to the combine name for it to join the parent lot. If there is no combinename (which is inserted from RouteParamDef), one will be created and the route updated.
Add the splitname to the lot load*
Add the split lot id to the parent lot linked list*
* This is performed by a User Exit in AS. The database Client database sets the splitname combinename and parent lot in custom fields in the operstat (lot) record.
End if
Note: Because rework steps are explicit for each place in PROMIS but are more generic in AS, the resulting names may be different.
Temporary Splits that are not Rework
Arbitrary temporary splits will preferably not be handled.
Test Stations
At test stations, identified by equipment type/stnfam= 1PCTEST, the lot may be all or partially retested. The rework route will rejoin at the same step and the split combine is there also. i.e. if test is at step 10, rework route is on step 10, rejoin is step 10 and combine is step 10. The combine name will already be in the route. If the lot is in rework, the rework flag will be set.

Wet Stations
At Wet Stations, the lot will be placed on the Wet Station rework route. This is identified by first checking the Asspecproc in the WIP. The rentry attribute of the Lot will be set to the current step. The lot will be placed at the start of the Wet station process because there is currently no way to determine where in the Wet Station sequence a lot is. The parameters will be set as follows:
    Nonstd=yes
    NsRtePart=R+stnfam+Equipment Program id
    Rentry=Current step
    Curstep
    Curstn
    stpst=
Aborted Track-ins
Aborted Track-ins will not cause duplicate entries in the Order table. This currently happens when a certain report is run to feed the offline scheduler.
Alternative Steps
The mapping of alternative steps will be handled in PROMIS and be transparent to the Schedule database. The logic that PROMIS will use is as follows:

e.g. 1000 Normal step
1000.Al Alternative step
If lot is in process and in the Alternative Step
current step=1000.Al
Else (lot in wait)
current step=I 000
Endif PM Orders The PM Orders specify the PM operations that are to be scheduled for a piece of equipment (stn).

| PMOrderBuffer Field | Comment |
|---|---|
| PMOrder | Name of PM |
| EquipmentID | Equipment PM is to be performed on |
| Duetime | date/time when PM will start |
| Ptime | time PM is expected to take (floating point mins) |
| Winmin | Float |
| Wimmax | Float |
| Interval | Floating point mins |
| Frequency | Characteristic (weekly, monthly, etc.) |
| DayofWeek | Integer |
| WeekofMonth | Integer |
| MonthofYear | Integer |

Details of Mapping

The mapping is as follows:

| PROMIS | database Client | Comment |
|---|---|---|
| Task ID | PMOrder | |
| Equipment ID | Stn | |
| Duedate | duedate | |
| Ptime | Ptime | |
| | Ptunits | mins |

These fields are copied into the database by are not used by AS at present:

| | |
|---|---|
| Winmin | Custm2 |
| Winmax | Custm3 |
| Interval | Custm4 |
| Frequency | Custm5 |
| DayofWeek | d2 |
| WeekofMonth | d3 |
| MonthofYear | d2 |

All existing PM Orders are deleted.

PM Counters

In addition to the standard PM supported by AS, there are some additional requirements based on various rules peculiar to the equipment used. These will be handled by some additional fields in the data imported from PROMIS.

The information that comes from PROMIS at T2 will be mapped to a buffer table as follows. The trigger can be set when the table has been loaded.

| PMCountBuffer Field | Comments |
|---|---|
| EquipmentID | |
| TaskID | |
| Limit | |
| Winmin | Float |
| Winmax | Float |
| Arg | Integer |
| PMDuration | Time required to do the PM (floating pt mins) |
| CounterType | e.g. RF units |
| CounterValue | Current value of PM counter |

PROMIS will add some additional fields to the end of the station and route records. These are defined in the sections on importing Routes and Stnfams.

Stnfam

Stnfam Rule1 Rule2 Rule3

Route

Step (Rule 1) Arg I Arg2 Arg3 (Rule2) Arg I Arg2 Arg3 (Rule3) Arg I Arg2 Arg3

This says that for a given equipment type up to three rules can be applied. The parameters used in these rules depend on the step that is being performed.

The rules accumulate counters for the stn (equipment identification) which are then checked against the PM limit table for that equipment id. AS should not start a step if the PM limit will be exceeded during that step given the Window.

The rule will calculate the value for the step based on the lot, etc., and then add the result to the appropriate PM load. It will be hard coded to know which type of load it is looking for using counter type.

When a PM happens, the equipment will be out of service for PM for duration hours.

Details of Mapping

Each record in the PM Count Buffer will create a record set (a PM and MTTR row) in the Calendar file and a record in the Calendar Attachment file. All existing PM records will be deleted from the Calendar file and all PM records will be deleted from the Attachment file.

| PCounter table PROMIS | database Client | Comments, examples |
|---|---|---|
| Equipment id | Attach.Resname | Equipment that PM is for. |
| Task | Cal.Calname | The name of the PM load to pull this stn out of service identifier that |
| | Attach.Calname | the user can understand in relation to this PM. |
| counter type | Cal.Ref | What the rule is looking for. Sets the Calendar.ref field as follows: Lot=mttf_by_lot |

-continued

| PCounter table PROMIS | database Client | Comments, examples |
|---|---|---|
| | | Wafer=mttf_by_pieces |
| | | xxxx=mttf_by_xxxx |
| current value | Cal.Custm1 | How many units accumulated since last PM. |
| limit | Cal.Arg1 | Limit for counter value within window. Calendar.arg1 |
| Winmin | Custm2 | Window in which PM must be performed (in units). |
| Winmax | Cal.Custm3 | Window in which PM must be performed (in units) |
| Duration | Calmttr.Arg1 | MTTPM (floating pt mins) |
| Arg | Cal.Custm4 | Chamber number 1–3. Anything else is interpreted as 1. |
| — | Attach.Restype | Stn |
| — | Attach.Caltype | PM |
| — | Attach.FOA | blank |
| StnDef | | |

On export to AS, the fields in stnfam will be copied to the stns in their family in the stn.txt file. They are not copied to these fields within the database.

| Stnfamdef | StnDef |
|---|---|
| PMRule1 | Custm13 |
| PMRule2 | Custm14 |
| PMRule3 | Custm15 |

If the simulation decides that a PM is due, it will create a PM Order that will show up on the dispatch list for that equipment id.
Creating the Schedule
Data Export to AutoSched (.asdfiles)

Most of the files are created directly from the definition tables in the database which are created by the PROMIS import and/or manually as described above. there are the following exceptions:

The Route file is joined with the TACTdef table to create the various step times. Each operdef/step record will be joined with its TACT record as follows:

| Operdef | TACTdef |
|---|---|
| Stag | Stage |
| Stnfam | Stnfam |
| EquipmentProgId | EquipmentProgId |
| ReticleId | ReticleId |
| Useflag | PRODUCTION or NEW |

The following fields are setup in the route file based on this join:

| | |
|---|---|
| Ptime | tactdef.ptime |
| Custm10 | tactdef.stime |
| Custm 11 | tactdef.unsetuptime |
| xpiece | IF operdef.ptper='xpiece' THEN tactdef.batchqty ELSE 0 |
| setup | IF operdef.setup='none' THEN" ELSE operdef.setup ENDIF |

The simulation start time in the Options.def file is set to the T2 extraction time that was passed in the first line of the WIPstatus file.

The schedule name is generated at the time of the run and is related to when the schedule is run, not the T2 time. It is geneated as follows:
Fab1a<mmdd>-<hhmm>
Create Dispatch List At T2 a new WIP dataset will be extracted from PROMIS while the current schedule and status is being used by the Fab. There are a number of sequencing problems that will be handled as described here.

In the "steady state", the lot status will be in the Lotstat table, one row per lot and the schedule will be in the as-schedule table keyed by model name (PRODUCTION) and the name of the schedule. At T2, the WIP status is placed into the Orderstat table and then passed to AutoSched. Meanwhile, the Lotstat table is the table being used for the schedule display. When the schedule is complete, it will be placed into the as-schedule table under a new name and the Lotstat table will be overwritten with the Orders from Orderstat from which the schedule was created. The oldest schedule will be deleted.

The process joins Orderstat and as-schedule and copies it to Lotstat. The current step, stn from Orderstat are copied to the current step fields in Lotstat. The step, stn information from the first step for that Lot that appears in the schedule are copied into the next step fields. If the status is WAITING or the status is RUNNING and the current step equals the first one found in the schedule, operseqval is set to the seqnum of the row in the schedule. Otherwise, a RUNNING lot whose current step does not equal the first step in the schedule has operseqval set to 1. The Area corresponding to the stnfam is placed in the areaname or nextareaname fields. It is obtained from data1 field in stnfamdef. When this is complete, the current schedule is changed by setting the new schedule name in the currentschedule fields in the system-data table.

This means that:

a) If the lot status is WAITING, the next step fields will be set to the next scheduled step. If the status is RUNNING, the next step fields will be set to the next scheduled step which will normally be the one that is running. i.e. the same as the current step. This sets lotstat up as though it were in the steady state.

b) If a lot is not in the schedule, it will be copied to Lotstat with operseqval set to 0 indicating that there is no schedule.

There is no provision to send lots that are in the Hold state.

The T2 data extraction in PROMIS is not logically instantaneous. This means that the status of lots can change between the time the extraction is started and the time it completes. If a trackin/out is performed during this time, they should be applied to the resulting schedule if they happen after the affected lot was extracted, but ignored if they happen after T2 start but before the lot is extracted. There is no explicit way of knowing which is which so a certain degree of robustness must be built in and it must be understood that there may occasionally be a few lots that are out of step with PROMIS until a transaction is performed against them.

There will be a delay from between the start of the T2 data extraction and the installation of the resulting new schedule. Trackin/out generated during this time must be applied to both the current status and the new status when the new schedule is installed.

In the "steady state" Trackin/out transactions will be processed but left in the buffer table. They will be marked with the current schedule name. New transactions will have the schedule name set to the empty string. The Trackin/out database Procedure will only process records that do not have this field set to the current schedule name so a record will only be processed once for a given schedule.

At T2, a new set of WIP data will be extracted along with the start time of the extraction. This data will be placed into Orderstat. All records in the transaction buffer table that have a time before the T2 download start which have been processed for the current schedule, will be deleted because they cannot possibly be relevant to the new T2 data.

The schedule will then be run using the data in orderstat. Meanwhile transactions will continue to be processed to update Lotstat as described above for the "steady state".

When the schedule is complete it will be installed in as-schedule under a new name. The Orderstat records will overwrite the Lotstat records and the current schedule name will be changed to the new one. The database procedure will be triggered to process the transaction buffer table.

The existing records in the transaction buffer table will have been marked with the name of the previous schedule, not the new current one. Therefore, they will all be reprocessed against the current schedule which will bring the status up to date with all the transactions that have occurred since the start of the T2 extraction. The records will be marked with the new schedule name. They will be deleted when the next T2 download arrives.

This protocol closes almost all of the gaps. The only issue is that there could be a few extra transactions that are not required. This will happen for lots that have transactions after the start of the T2 download but before they are extracted and put into the T2 dataset. If the database client cannot find a match for a transaction, no status update will take place, it will just be marked as processed. The protocol will not miss transactions, it may just have a few extras.

WIP Transaction Processing

The PROMIS transaction messages will be sent over the TIB message bus from the VAX to the HP. There will be a TIB adapter on the HP to receive the messages. The records will be written to a database buffer table.

A database procedure will be fired by a database trigger every time a record is inserted into the buffer table. it will read the next record from the table and then update the dispatch list to reflect the new status. It will process every record in the buffer that does not have the Schedule_ processed field set to the currently active schedule. Records are processed in time order.

Each message from PROMIS will contain the following information.

| WIPtransactionbuffer Field | Comments |
|---|---|
| Lot | Lot Id |
| CurStep | |
| Device | Device |
| Type | I/O/A/N for trackin/out/abort/new lot |
| EquipmentId | Stn |
| EquipmentType | Stnfam |
| EquipmentProgId | |
| Qty | current qty in lot |
| OperatorId | not used |
| Transtime | Time of transaction |
| Schedule_processed | Schedule against which this was processed Null when placed into the buffer. |
| Action | A trace field that is populated when a transaction is processed. Null when transaction is placed in the buffer |

Steady State

In the steady state, when the Lotstat table has been created, the relevant Lotstat fields will be as indicated and the PROMIS transactions will be processed as follows:

| Current status = RUNNING | |
|---|---|
| lotuserstat | 'RUNNING', |
| lotqty | current lot qty |
| stnfam | equipment type of current step |
| stn | current equipment id |
| areaname | area of current stnfam |
| opername | current step |
| setup | current setup |
| stage | current stage |
| nextstn | n/a |
| nextstnfam | n/a |
| nextopername | n/a |
| nextsetup | n/a |
| nextstage | n/a |
| nextareaname | n/a |
| operseqval | seqnum of this step record in the current schedule (as -schedule). This will be the first occurrence of the step (i.e. if there is a setup and process, it will be the setup) |
| Current status WAITING | |
| lotuserstat | WAITING' |
| lotqty | current lot qty |
| stnfam | n/a |
| stn | n/a |
| areaname | n/a |
| opername | n/a |
| setup | n/a |
| stage | n/a |
| nextstn | next scheduled equipment id |
| nextstnfam | next scheduled equipment type |
| nextopername | next scheduled step |
| nextsetup | next scheduled equipment program id |
| nextstage | next scheduled stage |
| nextareaname | next scheduled area |
| operseqval | seqnum of next step record in the current schedule (as-schedule). |

If operseqval is 0, the lot was either not scheduled or has moved past the end of the schedule. In this case, the lot will move as directed by PROMIS and not reference the schedule.

Transactions 5.2.1 O=Trackout

PROMIS indicates the next step that it expects to perform from its routing. This should be the same as the schedule assuming that the schedule has been run far enough out and that it has not chosen an alternative step. The system must calculate the next step to be performed so that it can be displayed on the dispatch list. It will search ahead from the current position (operseqval) in the schedule to find the next expected step. This is the next step that is different to the current one in the schedule ( this gets over multiple rows for setup/process etc.) and that is not at a Wet station. The resulting step should be the same as PROMIS. If it is not, the step from the schedule will be used. The next step fields will be set up to the next step as indicated by the schedule. The next stage, setup and stnfam are found by fading the step in operdef The operseqval will be set to point to the next step in the schedule.

If there is no schedule (operseqval=0), or the trackout was from the last step in the schedule for this lot, the next step fields will be set to whatever PROMIS indicated. The next stage, stnfam and setup will be found from operdef. The next stn will be set to blank because the routing indicates only the stnfam. If the step cannot be found in the normal route, the stage, stnfam and setup will be set to blank. Once the step indicated by PROMIS cannot be found in the schedule, operseqval will be set to zero and the system will stop attempting to show the schedule for this Lot, it will be tracked to match whatever PROMIS indicates in the transactions.

If the step value is FINISH, SCRAP, NOSTEP then lot tracking will stop. The lot will remain in Lotstat, its status will be set to the step value (FINISH, SCRAP, NOSTEP) and operseqval to 0. Future transactions against this lot will be ignored. The current and next step fields will not be altered.

I=Trackin

The lot should currently be in the WAITING, QUEUEHOLD, TRACKOUTHOLD states when a Trackin is received. The lot will always be tracked into the step indicated by PROMIS. The 'current' fields in Lotstat will be altered to reflect this.

The step that it has been tracked into should be the same as the next scheduled step indicated in Lotstat. The operseqval in Lotstat should already be pointing to this step because it was set up during the trackout so will not change. The next stage will be copied from the next fields to the current fields. The current stn, stnfam, setup will be those sent from PROMIS.

If the step that the lot is tracked into is not what was expected, the schedule will be searched for the step that it was tracked into. If it is found the operseqval field in Lotstat will be updated to that value. The stage will be obtained[ from the corresponding step in the route. The current stn, stnfam, setup will be those sent from PROMIS.

If the step is not in the schedule, the stage will be found from the current route for the step that was sent. If the step cannot be found the stage will be blank. The current stn, stnfam, setup will be those sent from PROMIS. This logic will always be performed if there is no schedule for the lot (operseqval=0).

A=Abort

The lot must be in the RUNNING state. It will remain at the current step but its state will be changed to WAITING. No other fields will be changed. The lot will then appear as a WAITING lot but it will use the next step fields. The next step will be the same as the one just aborted not what the schedule predicted.

H=Hold

PROMIS will indicate the step in the message

If the step is the same as the current step

|  |  |  |  |
|---|---|---|---|
| else | lotuserstat | = | TRACKOUTHOLD |
|  | lotuserstat | = | QUEUEHOLD |
| end if |  |  |  |

The other fields will be setup as though it was a trackout. The next transaction that could be received for this lot is a Trackin to the next step, although the PROMIS operator has to perform other actions before this can happen.

N=New Lot

A new lot record will be created in Lotstat. The lot will not be added to Orderstat. By definition, it will not have an schedule. The route will be found from the device/partdef record and then the other fields looked up in the route if they exist. The fields will be set up as follows:

| | |
|---|---|
| lotuserstat | 'WAITING' |
| lotqty | current lot qty |
| stnfam | n/a |
| stn | n/ii |
| areaname | n/a |
| opername | n/a |
| setup | n/a |
| stage | n/a |
| nextstn | n/a |
| nextstnfam | next stnfam from route if exists |
| nextopername | next step from transaction |
| nextsetup | current setup from route if exists |
| nextstage | next stage from route if exists |
| nextareaname | next area from stnfamdef |
| operseqval | 0 |
| partname | from the active partdef record for this device |
| routename | from the active partdef record for this device |
| priority | 3 |

Logging Actions

To aid in debugging an extra field called 'action' has been added to the wiptransactionbuffer table. This field will be updated when the transaction is processed. The wiptransactionbuffer records are deleted at T2, so the log is not permanent.

Notes

If a transaction is received that has no match, apart from the situation described above, it will not update a Lotstat and will effectively be ignored. It will remain in the buffer in case it applies to the next T2 download. i.e. if operators do steps in a different sequence to that of the schedule, which directly reflects the routing, the status of that Lot will not be synchronized between the database and PROMIS.

Schedule Display

Schedule Display Screen

The Schedule/Dispatch List display will be created using ORACLE Forms tool and will be an HP/UX process. It is a report (i.e. has no database update capability) that the user can filter by:

| |
|---|
| Equipment ID (Stn) |
| Equipment Type (Stnfam) |
| Cluster |
| Area |
| Lot |

The columns on the screen will be:

| Name | Column Width |
|---|---|
| Equipment id (Stn) | 4 |
| Priority of lot | 1 |
| Lot id | 12 |
| Lot Type | 2 |
| Scheduled start time | 18* |
| Equipment Prog Id | 12 |
| Stage | 10 |
| Device | 12 |
| Qty of wafers in lot | 2 |

*assumes dd/mm/yy hh:mm:ss. All that is really needed is day/hour/min so some adjustment may be made to this.

All Lots with a status of WAITING will appear first followed by all Lots with a status of RUNNING. Rows will be ordered by scheduled start time within the WAITING group and be actual start time within the RUNNING group. The next sort order will be priority. Earliest times will be higher on the screen.

Other information:

Time that schedule was created

Time that the last refresh was performed

The rows will be color coded to reflect the status and/or priority of the lot. It may be necessary to trim some of these fields or use horizontal scrolling if the real-estate is tight. A similar screen will also be available on the database Client. The user will be able to look upstream by selecting the appropriate stnfam view.

There will be a refresh key so that the operator can refresh the screen with the latest data without changing the selection.

Preferred color coding scheme:

| Priority | Run/Wait | Foreground | Background |
|---|---|---|---|
| 1–2 | Run | White | Red |
| 1–2 | Wait | Red | White/light |
| 3–5 | Run | Black | Green |
| 3–5 | Wait | Black | White/light |

The sequence of events that the operator will use to process a lot is approximately:

a) Select the dispatch list for the equipment id that needs work.

b) Note the next lots scheduled and go and find the lot c) Return to the equipment with the Lot and perform the normal PROMIS Track-in procedure.

d) The lotstat database table will be updated from a message from PROMIS

Invoking the Schedule Display

The schedule will be displayed on the same X-windows terminal as the PROMIS interface except that it will use a different session driven from the HP. The operator will be able to switch between the two sessions using the mouse or by Alt-Shift as they do with the cell controller.

TACT Data Algorithms

TACT Table

The TACT data is used to calculate Ptime, Ptper, Xpiece, Setup, Unsetup for each operation/step in the route file that is passed to AS for use in the simulation. The TACT times are independent of the route and are dependent on the equipment type and process being performed. The TACT data will be kept in a database table. It will be maintained manually and will not have automatic updates performed by the PROMIS data import.

| TactDef table | | |
|---|---|---|
| Field | Keys | Comment |
| Stage | Primary Key | |
| RecipeTitle | Primary Key | |
| Stnfam | Primary Key | |
| EquipmentProgId | Primary Key | |
| reticleId | Primary Key | |
| useflag | | |
| t0 | | Times in floating point mins |
| t1 | | |
| t21 | | |
| t22 | | |
| t23 | | |
| t24 | | |
| t25 | | |
| t3 | | |
| batchqty | | |
| Comment | | |
| Cycle | | Sum all T |
| CycleT0 | | Cycle - T0 |
| Machine | | (Sum all T)/batchqty |
| MachineT0 | | Machine - T0/batchqty |
| Ptime | | Calculated by Algorithm |
| Stime | | Calculated by Algorithm |
| UnsetupTime | | Calculated by Algorithm |
| LapTime | | Calculated by Algorithm |
| Tactid | Primary Key | 0 if useflag=PRODUCTION or NEW. A unique value otherwise. |

Each record will have a control flag that will have the following meanings:

PRODUCTION Use for production calculations

SAVE Save but do, not use in production

NEW Record will be used in production but should be manually updated (only default times)

The calculated times are all in minutes.

Note: Calculated fields cannot be changed directly on the screen. They are recalculated when the argument fields on the same row are changed.

Note. There can be only one record for a given set of unique keys with a useflag of PRODUCTION or NEW. The database keys are set up to prevent this from happening.

Change History

Every time a change is made and saved to a record, a record will be created in the TACThist table which is a copy of the status record. Reports can be written to provide a history of all of the changes to a given TACT. History is created when a record is added or changed.

| TACThist table | | |
|---|---|---|
| Field | Keys | Comment |
| Stage | Primary Key | |
| RecipeTitle | Primary Key | |
| Stnfam | Primary Key | |
| EQUIpmentProgId | Primary Key | |
| ReticleId | Primary Key | |
| EffectiveTime | | Time change was made |
| Userid | | User making the change |
| Badge | | Badge/Username of user making the change |
| Comment | | Copied from the def table |
| t0 | | Times in floating point mins |

-continued

TACThist table

| Field | Keys | Comment |
| --- | --- | --- |
| t1 | | |
| t21 | | |
| t22 | | |
| t23 | | |
| t24 | | |
| t25 | | |
| t3 | | |
| Batchqty | | |
| CycleTO | | |
| Cycle | | |
| MachineTO | | |
| Machine | | |
| Ptime | | |
| Stime | | |
| Unsetuptime | | |
| LapTime | | |

TACT Definition
Add New TACT records from Routes

There will be a function that allows the user to scan the routes in the database and automatically add entries for steps that have no TACT entry with a useflag of NEW or PRODUCTION. i.e. every step with a unique combination in of the following fields:
  Stage
  Equipment type (stnfam)
  Equipment Program Id
  Recipe Title
  Reticle Id
will have an entry created in the TACT definition table if one does not already exist. This procedure could take a minute or more to run depending on the number of steps. The new TACTdef entries will be given the useflag of NEW.

Delete unwanted TACT records by comparison with Routes

There will be a function to delete all entries that have no corresponding steps in the routes. The criteria used is the same for adding records.

Expressions

The Ptime, Setup, Unsetup and Lap times will be calculated by user defined algorithms based on values in the TACT table. The Xpiece will be decided based on the ptper copied from Stnfamdef. (blank if ptper=piece, batch size from TACT if ptper=xpiece). There may be a number of different algorithms in use depending on the type of equipment. The stnfamdef table will have new field that references the algorithms to be used to calculate the fields for TACT records for that stnfam.

There will be a new table that will hold the formulae for calculating the fields derived by these algorithms. The correct set of formulae to be applied to a given row on the TACT table will be found by looking up the TACTformula field in the corresponding stnfamdef record. The calculated fields will be derived only from data in the TACTdef table record and the corresponding stnfamdef record.

When the AS route file is derived from the database, the appropriate fields from the TACT records that correspond to each step will be copied in. No calculation will be necessary as the results will already have been derived and stored in the TACTdef record. See the section on running the schedule for details.

TACT Expression Maintenance

There will be a special screen, TACT Formula Definition, that will allow the user to create and maintain expressions/formulae to be used to calculate the fields in the TACTdef table. This screen will provide a "test" function so that the expression can be verified to be syntactically correct and the results on a test dataset can be viewed.

Each expression set will be given a name which can them be referenced by the stnfamdef field TACT function. There will actually by four expressions in an expression set to calculate the TACTdef fields ptime, stime, unsetuptime, laptime.

The expressions can include any field in the TACTdef record plus any appropriate field in the associated stnfamdef record. Constants can also be used.

The screen will allow the user to select the formula to be edited from a list of current formulae or to add a new one. There will be fields for each of the four algorithms. The user clicks on the field to be changed and then makes modifications using normal editing.

There will be a single record (1 row) DW to represent each column of the TACT definition. The user may fill in the fields with. any valid set of numbers and then click "test" to run the algorithm against the data and check that the expression is valid and that the answers are correct. Default values will be placed in the test data when the screen is opened.

When a formula is changed, the affected TACTdef rows must be recalculated for it to have any effect. The user can do this by going to the TACTdef screen and regenerating the appropriate records. For convenience, there will be a button on the TACT Formula Definition that will automatically invoke the TACTdef screen, run the regeneration function and close the screen again.

Stnfam Definition

The Stnfam Definition Screen allows the user to specify the formula set that will be used to calculate the TACT times for steps using that Stnfam (Equipment Type). If the user changes the formula to be used for a given stnfam, all the TACT times for that stnfam must be recalculated by opening the TACT Definition or TACT Formula Definition screens and regenerating the TACT times.

Kanban Worksheet

This screen will provide the user with a method of generating Kanban points using the method of assigning kanbans based on amount of processing time required for production. e.g. by having a kanban stage be a group of steps that can be done in a 24 hour period. The screen will generate records in the Kanbandef and KanbanXref tables. There will be a new screen on the database Client that will work as follows:

The user will be able to adjust the following values which will be used to calculate values in the derived columns.

| Name | Default |
| --- | --- |
| Multiplier | 1 |
| Required number of wafers out | none |
| Interval (days) | 1 |
| Standard lot size | 25 |
| Plan days in the month | 30 |

The user will retrieve a route from the route selection DDDW. Only routes that are associated with a part that has a non-null device can be selected because the KanbanXref table is keyed by device.

When the user has specified these parameters a grid with the following columns will be displayed:

| | |
|---|---|
| Stage | PROMIS stage |
| Step | Step |
| Equipment Prog Id | |
| Lap time | Calculated from TACT (hrs) |
| Target Lap time | Lap Time*Multiplier/24 (days) |
| Cumulative Target Days | Ceiling(Sum(Target Lap Time)) |
| Standard WIP | Target*Daily wafer throughput (Daily throughput = Req wafers out/Plan days in month) |
| Standard WIP in lots | Standard WIP/Standard Lot size |
| Cumulative Lots | Running total of Standard WIP lots |
| Kanban qty | see below |
| Manager Factor | Input by user. Defaults to 1 |
| Adjusted Kanban qty | Kanban qty * Manager Factor |
| Kanban name | see below |
| Kanban markers | Indication of where the kanban stages are currently configured |

The following display-only fields are also included:
Device
Active Flag
Number of Steps
Number of Kanban Stages When the route is displayed, the current kanban stages for that device will be shown by setting the indicators automatically. This information is taken from the KanbanXref table, not the route table.

The user can automatically set the kanban stages based on the Interval. The system will scan down the steps and set the kanban stages at the points where the Cumulative Target Days column changes to the next Interval increment (e.g. if the Interval is 3, the first Kanban stage will start at the first step and end on the last step that has a value of 3. The next stage will start on the first step that has a value of 4 etc.

However, some adjustment should be made so that kanban stages do not start in the middle of stages or other logical points in production. The user will be able to place pointers on rows by simply clicking there. He may place as many pointers as he wishes. The system will automatically calculate the kanban qty based on the kanban stages. This is the number of lots that can be in process at that kanban stage at any time. The user will be able to manually override these numbers.

There is a column on the right hand side of the Data Window that the user clicks on to set pointers. This column is a separate Data Window and is always there even if the main Data Window is horizontally scrolled. The begining and end of a kanban stage is indicated by a green or red arrow. If the stage is a single step, a split green red arrow is used. The user sets kanban stages as follows:

| | |
|---|---|
| Begin kanban stage | Click on row |
| End kanban stage | Shift-click on row |
| Single step is a kanban stage | Click on row to make it a start of a stage Shift click on same row to make it an end also |
| Remove marker | Clicking on a row with any marker will move the marker |

When the kanban stages have been determined, the user clicks the Calculate button which will create Kanban names for each stage and calculate kanban quantities (Kanban qty). The Adjusted Kanban quantity is calculated by(Kanban qty * Manager Factor). The Manager Factor can be set for each Kanban by the user and is defaulted to 1. The user may alter the Kanban stage names if desired.

The user accepts the new kanban design by clicking the Save Kanban button which will populate the KanbanXref table as described above and overwrite any existing KanbanXref records for this route. It will also create records in the Kanbandef table. It will attempt to delete any previous entries from the Kanbandef table but this is not always possible due to the keys, so some periodic maintenance to remove unused entries may be necessary.

The user can then apply the new kanbans to all routes in the current model for the device by clicking the Update Routes button.

A new Kanban will be generated for this route by creating records in the Kanbandef table with the Kanban name of "K-<Device>-N". The kanban names will be created as defined above. Any existing records with this Kanban. name will be deleted. The fields in a new Kanban record will be populated as follows:

| | |
|---|---|
| Kanban | K - <Device>-N |
| Wkanbantype | Lot |
| Wkanbanatt | Anumpieces (default) |
| Wkanbanrule | rulek_FIFO (default) |
| Pkanbanqty | Adjusted Kanban Qty |
| Wkanabanqty | 1 |
| Pkanbantype | Lot |
| Pkanbanatt | blank (default) |
| Pkanbanrule | blank: (default) |

The "All Steps" button will automatically make every step a kanban stage and set all of the indicators appropriately. This is equivalent to the user setting them all by hand and then clicking the Calculate button. The user must still click the Generate Kanban button and Update Route button to actually change the database.

The Clear button will clear all of the kanban indicators on the screen but has no effect on the database.

A Kanban stage cannot start on an alternative step and alternative steps must be in the same stage as their 'master'. This will be taken into account when automatically generating stages. The Target Lap Time will be set to 0 for all alternative steps.

Note: This design does not have an additional table to store the calculations. When the screen is invoked, the values will be determined from the KanbanXref and Routedef tables. The advantage of this is that there is one less table to maintain and that the current data will be shown.

Stage Definition

There will be a new table that contains the valid stage names and the sequence number of the step in the route. This table can be populated through the Stage Definition screen. Each operation is associated with a stage. That stage should appear in the Stagedef table.

Stagedef will be model independent. A stage is unique for a device. The same stage name in the two different routings for the same device is the same stage. The same stage name in routings for two different devices will not necessarily be the same. For simplicity, stage names are defined to be unique within a route regardless of Device.

The Stagedef table will be maintained by a maintenance screen.. There will be a refresh button that will delete the current records from this table and then refresh the table by scanning all the routes in the current model to create a list of the unique stage names for each device from the currently active route. This should only be performed on the Production model. the sequence values from the first step in each stage will also be stored.

| | Stagedef | |
|---|---|---|
| Field Name | Keys | Comments |
| Stage | Primary Key | |
| Route | Primary Key | |
| Seqval | | Seqval of 1st step in stage |

Common Database

Some of the data in the Schedule database will be copied to the Common Database at a "snapshot" time.

| Table | Comment |
|---|---|
| StnfamDef | Equipment Type |
| StnDef | Equipment Id |
| PartDef | Device |
| RouteDef | Master Route record |
| OperDef | Step records for routes |
| StageDef* | List of valid stages |
| TACTdef* | TACT data |
| OrderStat | WIP/Lot status |

*Tables are not model dependent

The copying procedure must ensure that the data is consistent when it is copied and consider that an automatic download may be in progress. The routing information will be updated by a database procedure. This procedure will lock the tables for writing at the moment it is to occur. To ensure consistency, the process that copies the data to the Common database should do the same. To avoid deadlocks, it is important that locking of multiple tables always occurs in the same order. Most tables are model dependent and may have multiple models stored in them keyed by "modelname". We will designate a particular modelname to be used by the Common database extraction. The simplest way to ensure no inconsistencies is simply to make a copy of the desired model and then copy that. Copy model is a single command in the database Client.

| Locking Order |
|---|
| Equipment |
|    StnDef |
|    StnfamDef |
| Route |
|    StageDef |
|    OperDef |
|    RouteDef |
| Devices |
|    PartDef |
| WIP |
|    OrderStat |
| TACT |
|    TactDef |

AutoSched Model Changes

The current AutoSched model will not be sufficient to run the data from PROMIS. A number of customizations will be needed beyond those that have already been implemented. Documentation of the changes and the install procedure will be provided. The changes made by ASI will need a number of custom fields. ASI will use the fields starting from the highest number and working backwards to avoid conflict with existing customizations.

Splits

Standard AS does not have any way of being told that a lot is currently split and will rejoin its parent at some point. This involves a customization to add the split lot to its parent split linked lists. The splitname that will be used for the combine step must be added to the split's load. The information will be passed to AS in custom fields in the Order file.

PM Counts and Limits

The PM requirement is new and custom and will require AS model customizations. PM will be driven by a new custom table.

TACT

The TACT table provides the Ptime and Xpiece values which are standard fields in AS. It also supplies the setup and unsetup times which are additional custom fields in the step records.

Agenda

The current Agenda records are no longer needed because the setup and usetup time will be handled as custom fields in the step records.

.sch File

In order to import the schedule, the format of this file must be altered by a custom user exit.

Having fully described the preferred embodiments of the invention, variations and modifications may be employed without departing from the scope of the present invention. Accordingly, the following claims should be studied to learn the true scope of the present invention.

What is claimed is:

1. A modeling and manufacturing execution system comprising:

said manufacturing execution system for automatically controlling routing of product lots and production inputs in said manufacturing production line based on a production scheduling model, wherein feedback data from said production line is provided to said manufacturing execution system, said feedback data comprising operating parameters for equipment in said production line and identification of said equipment by type;

a database for storing said model, said feedback data and formulae for calculating a production capacity for each piece of said equipment based on said identified type of that piece of equipment and said operating parameters of that piece of equipment; and a simulating system for simulating operation of said production line according to said model, said simulating system using said formulae from said database to calculate said production capacities for said equipment in said production line;

wherein each formula in said database is associated with a flag having at least two values; a first of said values indicating that an associated formula is based on actual operation of equipment production of said production line; a second of said values indicating that an associated formula is new and unproven.

2. The system of claim 1, wherein said flag has a third value indicating that said simulating system should retain an associated formula in said database, but should ignore said associated formula in performing simulations.

3. A modeling and manufacturing execution system comprising:

said manufacturing execution system for automatically controlling routing of product lots and production inputs in said manufacturing production line based on a production scheduling model, wherein feedback data from said production line is provided to said manufacturing execution system, said feedback data comprising operating parameters for equipment in said production line and identification of said equipment by type;

a database for storing said model, said feedback data and formulae for calculating a production capacity for each piece of said equipment based on said identified type of that piece of equipment and said operating parameters of that piece of equipment; and a simulating system for simulating operation of said production line according to said model, said simulating system using said formulae from said database to calculate said production capacities for said equipment in said production line;

wherein said manufacturing execution system uses said production capacities generated by said simulating system to create a routing schedule for said production inputs and said product lots;

wherein said manufacturing execution system scans generated routes for equipment in said production line without a determined production capacity to determine potential problem areas in said generated routes.

4. The system of claim 1, wherein a safeguard system prevents a first formula with a flag of said first value and a second formula with a flag of said second value from being retained in said database where both said first and second formulas would be indicated for use in response to a given set of said feedback data.

5. A modeling and manufacturing execution method comprising:

automatically controlling routing of product lots and production inputs in a manufacturing production line with a manufacturing execution system based on a production scheduling model;

providing feedback data from said production line to said manufacturing execution system, said feedback data comprising operating parameters for equipment in said production line and identification of said equipment by type;

storing in a database said model, said feedback data and formulae for calculating a production capacity for each piece of said equipment based on said identified type of that piece of equipment and said operating parameters of that piece of equipment;

simulating operation of said production line with a simulation system according to said model and using said formulae to calculate said production capacities for said equipment in said production line; and associating each formula in said database with a flag having at least two values; a first of said values indicating that an associated formula is based on actual operation of equipment production of said production line; a second of said values indicating that an associated formula is new and unproven.

6. The method of claim 5, wherein said flag has a third value indicating that said simulating system should retain an associated formula in said database, but should ignore said associated formula in performing simulations.

7. A modeling and manufacturing execution method comprising:

automatically controlling routing of product lots and production inputs in a manufacturing production line with a manufacturing execution system based on a production scheduling model;

providing feedback data from said production line to said manufacturing execution system, said feedback data comprising operating parameters for equipment in said production line and identification of said equipment by type;

storing in a database said model, said feedback data and formulae for calculating a production capacity for each piece of said equipment based on said identified type of that piece of equipment and said operating parameters of that piece of equipment;

simulating operation of said production line with a simulation system according to said model and using said formulae to calculate said production capacities for said equipment in said production line;

generating a routing schedule for said production inputs and said product lots with said manufacturing execution system using said production capacities generated by said simulation system; and scanning generated routes for equipment in said production line without a determined production capacity to determine potential problem areas in said generated routes.

8. The method of claim 5, preventing a first formula with a flag of said first value and a second formula with a flag of said second value from being retained in said database where both said first and second formulas would be indicated for use in response to a given set of said feedback data.

* * * * *